(12) United States Patent
Raihn et al.

(10) Patent No.: US 10,305,447 B2
(45) Date of Patent: May 28, 2019

(54) ACOUSTIC WAVE FILTER WITH ENHANCED REJECTION

(71) Applicant: RESONANT INC., Santa Barbara, CA (US)

(72) Inventors: Kurt F. Raihn, Goleta, CA (US); Gregory L. Hey-Shipton, Santa Barbara, CA (US)

(73) Assignee: RESONANT INC., Goleta, CA (US)

( * ) Notice: Subject to any disclaimer, the term of this patent is extended or adjusted under 35 U.S.C. 154(b) by 83 days.

(21) Appl. No.: 15/443,740

(22) Filed: Feb. 27, 2017

(65) Prior Publication Data

US 2017/0179928 A1    Jun. 22, 2017

Related U.S. Application Data

(63) Continuation-in-part of application No. 14/941,451, filed on Nov. 13, 2015, now Pat. No. 9,608,595.

(51) Int. Cl.
*H03H 9/64* (2006.01)
*H03H 9/54* (2006.01)
*H03H 9/56* (2006.01)

(52) U.S. Cl.
CPC ............. *H03H 9/64* (2013.01); *H03H 9/542* (2013.01); *H03H 9/564* (2013.01); *H03H 9/6483* (2013.01); *H03H 9/568* (2013.01)

(58) Field of Classification Search
CPC ........... H03H 9/542; H03H 9/19; H03H 9/564
USPC ...................................................... 333/187
See application file for complete search history.

(56) References Cited

U.S. PATENT DOCUMENTS

| | | | |
|---|---|---|---|
| 5,821,834 A | 10/1998 | Xu et al. | |
| 5,933,062 A | 8/1999 | Kommrusch | |
| 6,018,281 A | 1/2000 | Taguchi et al. | |
| 6,043,585 A | 3/2000 | Plessky et al. | |
| 6,593,678 B1 | 7/2003 | Flowers | |
| 6,653,913 B2 | 11/2003 | Klee et al. | |

(Continued)

FOREIGN PATENT DOCUMENTS

| | | |
|---|---|---|
| EP | 2530837 A1 | 5/2012 |
| JP | 05-022074 | 1/1993 |

(Continued)

OTHER PUBLICATIONS

Song et al., "Topology Bandpass Filter with Spiral Capacitors", 62nd Electronic Components and Technology Conference (ECTC), 2012 IEEE, pp. 1758-1763.*

(Continued)

*Primary Examiner* — Benny T Lee
*Assistant Examiner* — Hafizur Rahman
(74) *Attorney, Agent, or Firm* — SoCal IP Law Group LLP; Nikki M. Dossman; Steven C. Sereboff

(57) ABSTRACT

An acoustic filter comprises a piezoelectric layer; an acoustic resonator structure monolithically disposed on the piezoelectric layer, the acoustic resonator structure including an arrangement of planar interdigitated resonator fingers; and a lumped capacitive structure monolithically disposed on the piezoelectric layer and being electrically coupled to the acoustic resonator structure, the lumped capacitive structure including an arrangement of planar interdigitated capacitive fingers, each of at least one of the interdigitated capacitive fingers having an edge that is entirely continuous.

22 Claims, 31 Drawing Sheets

(56) References Cited

U.S. PATENT DOCUMENTS

| | | |
|---|---|---|
| 7,034,638 B2 | 4/2006 | Yamamoto et al. |
| 7,616,079 B2 | 11/2009 | Tikka et al. |
| 8,179,211 B2 | 5/2012 | Bauer et al. |
| 8,552,818 B2 | 10/2013 | Kadota et al. |
| 2005/0212612 A1 | 9/2005 | Kawakubo et al. |
| 2015/0070227 A1 | 3/2015 | Kishino et al. |

FOREIGN PATENT DOCUMENTS

| | | |
|---|---|---|
| JP | 08-065089 | 3/1996 |
| JP | 2001044792 | 2/2001 |
| JP | 2002-299997 | 10/2002 |
| JP | 2013-243570 | 12/2013 |

OTHER PUBLICATIONS

Bickermann, "Thin Film Electroacoustic Devices", paper published in Klausurtagung in Pappenheim, 16.—Feb. 19, 2004, pp. 1-2.*
K.S. Van Dyke, Piezo-Electric Resonator and its Equivalent Network Proc. IRE, vol. 16, 1928, pp. 742-764.
PCT International Search Report for PCT/US2016/061725, Applicant: Resonant Inc., Form PCT/ISA/210 and 220, dated Feb. 24, 2017 (6pages).
PCT Written Opinion of the International Search Authority for PCT/US2016/061725, Applicant: Resonant Inc., Form PCT/ISA/237, dated Feb. 24, 2017 (9pages).

* cited by examiner

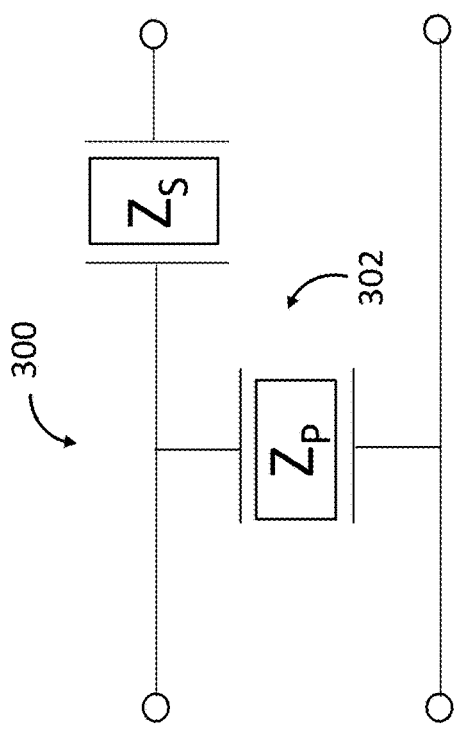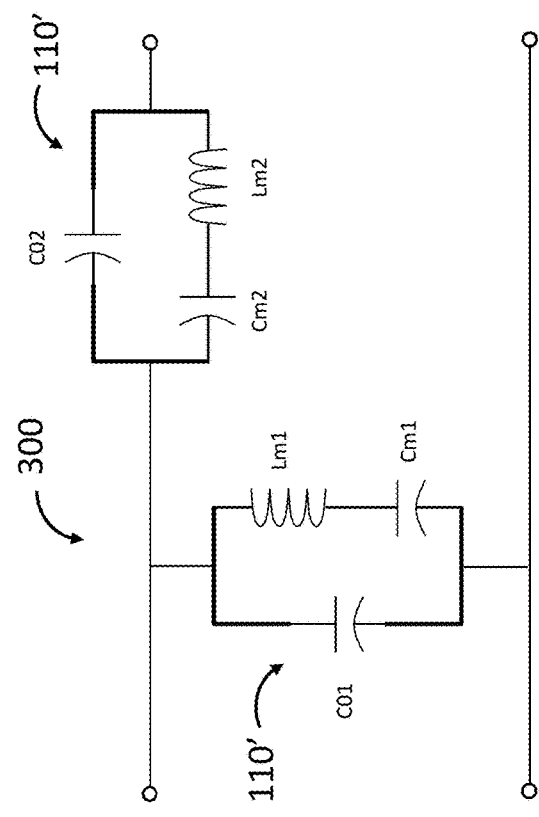
Fig. 13a
Fig. 13b

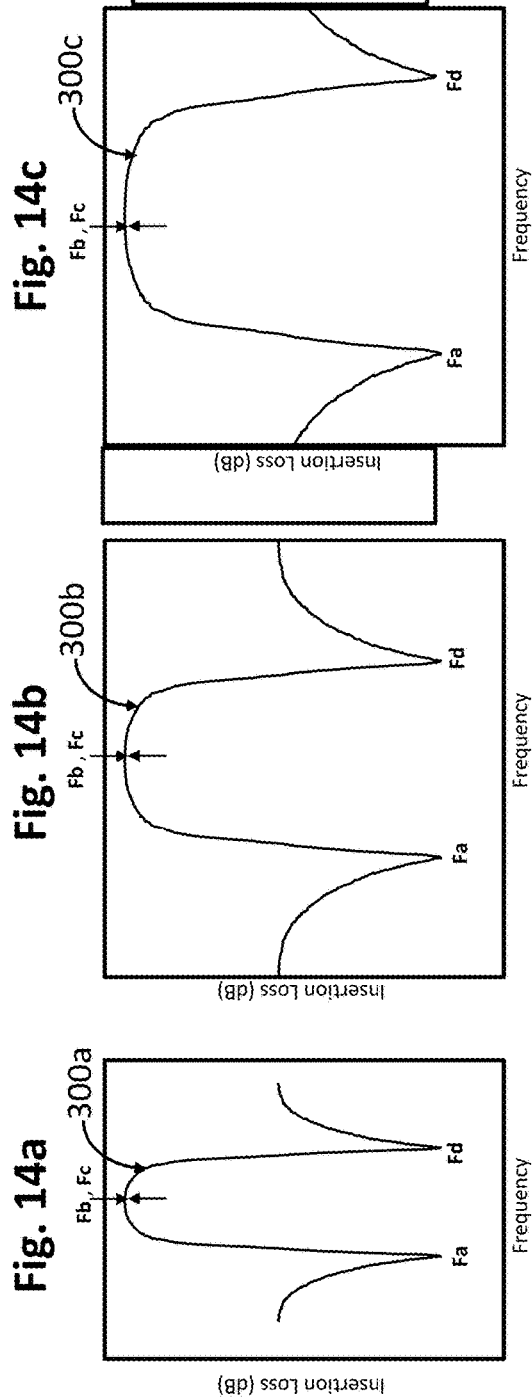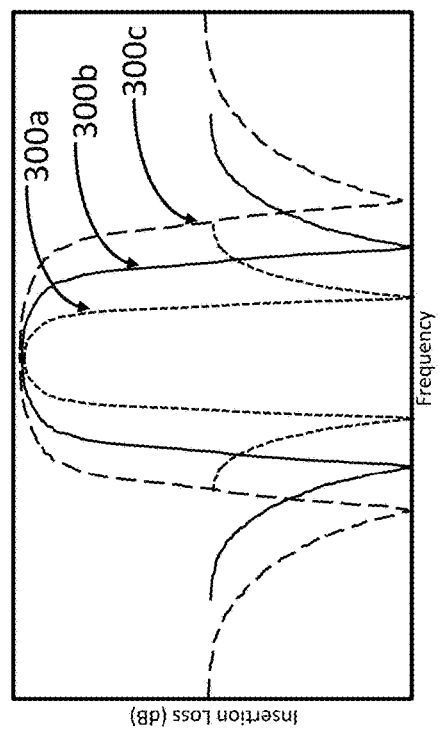

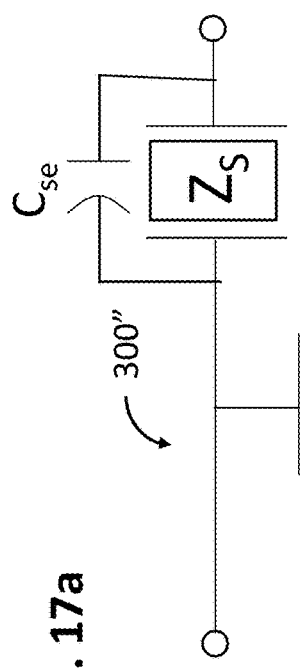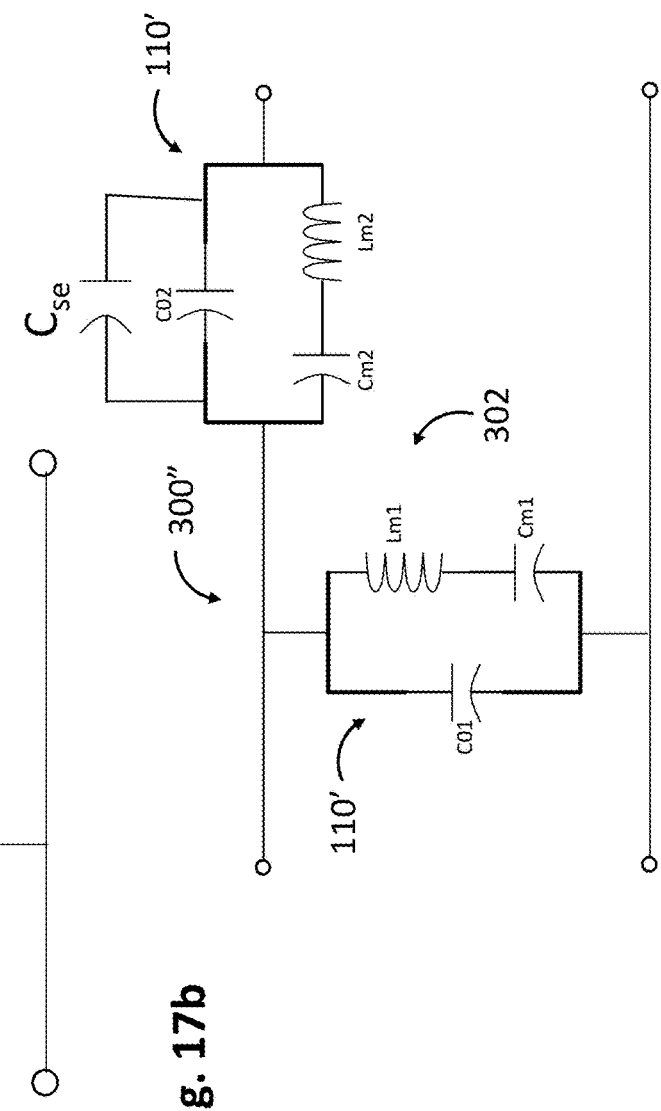
Fig. 17a
Fig. 17b

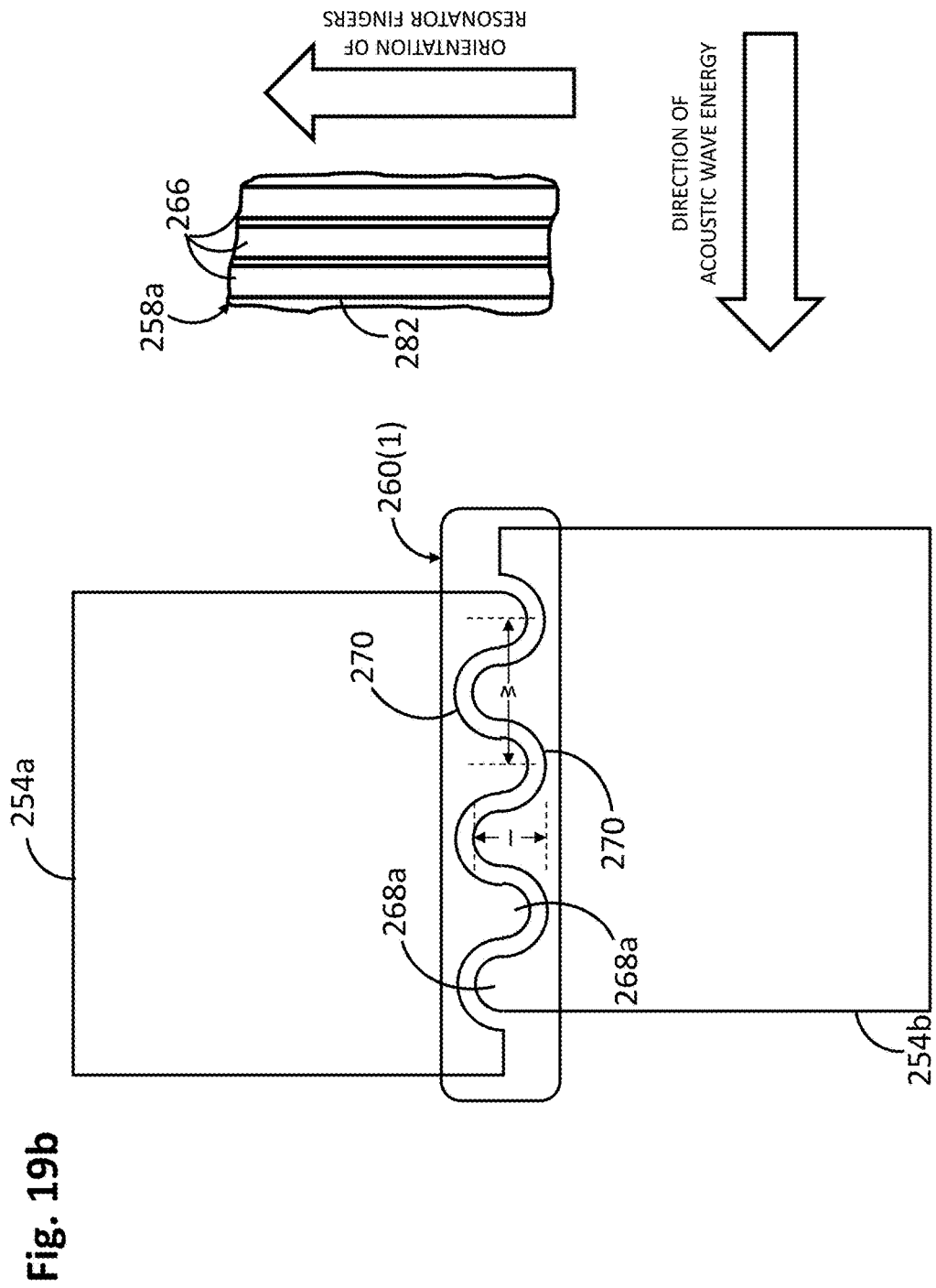

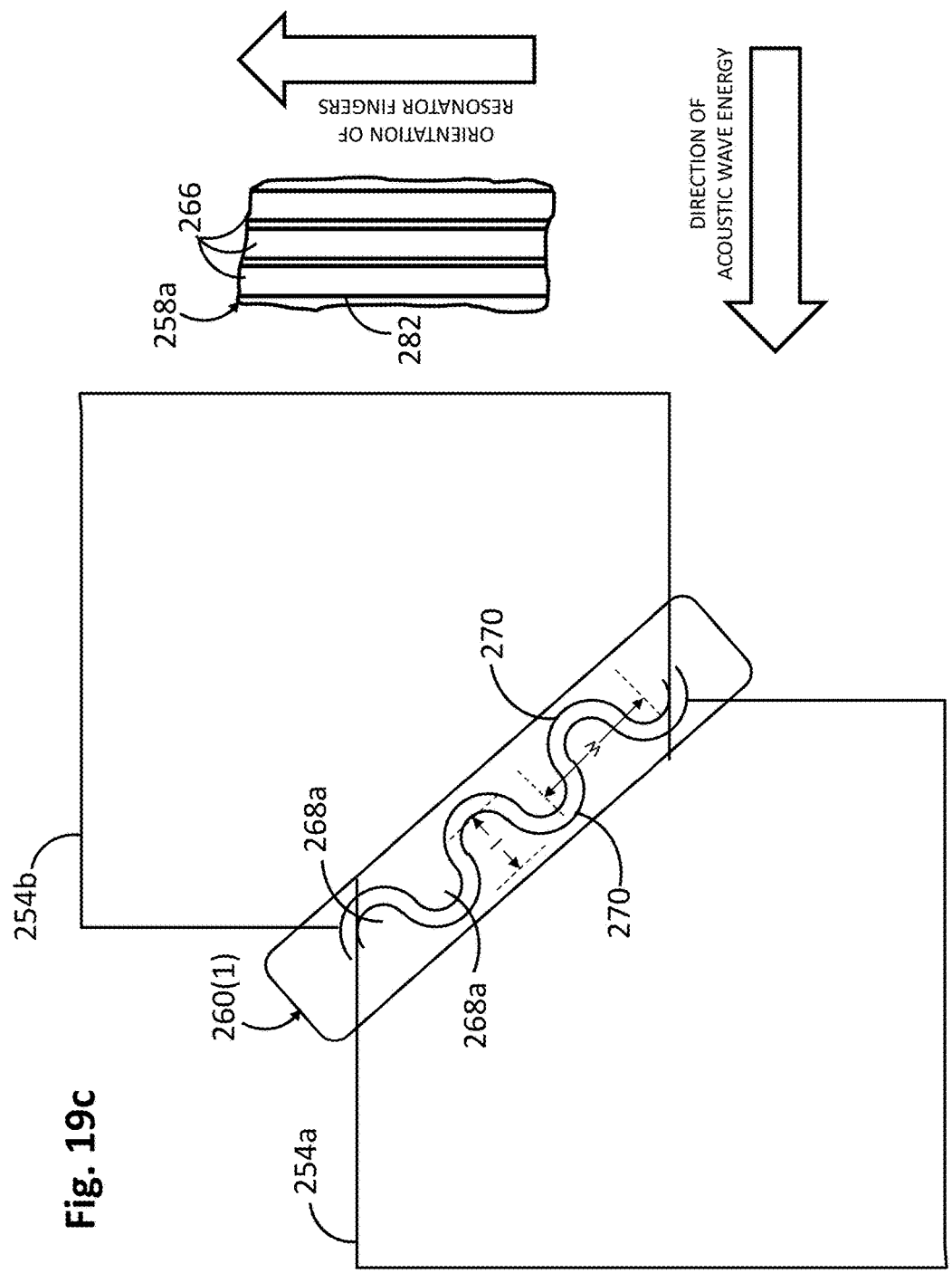

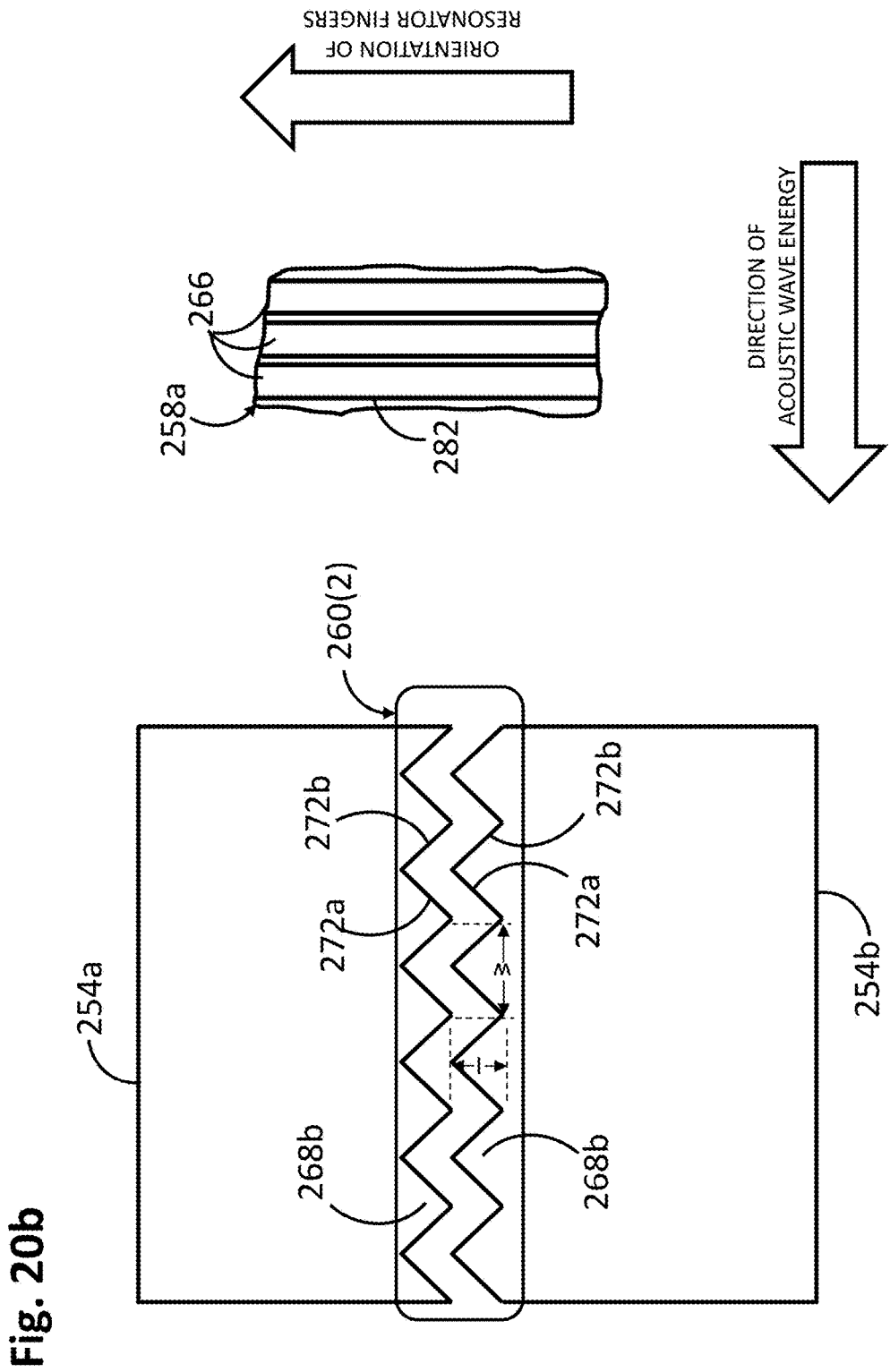

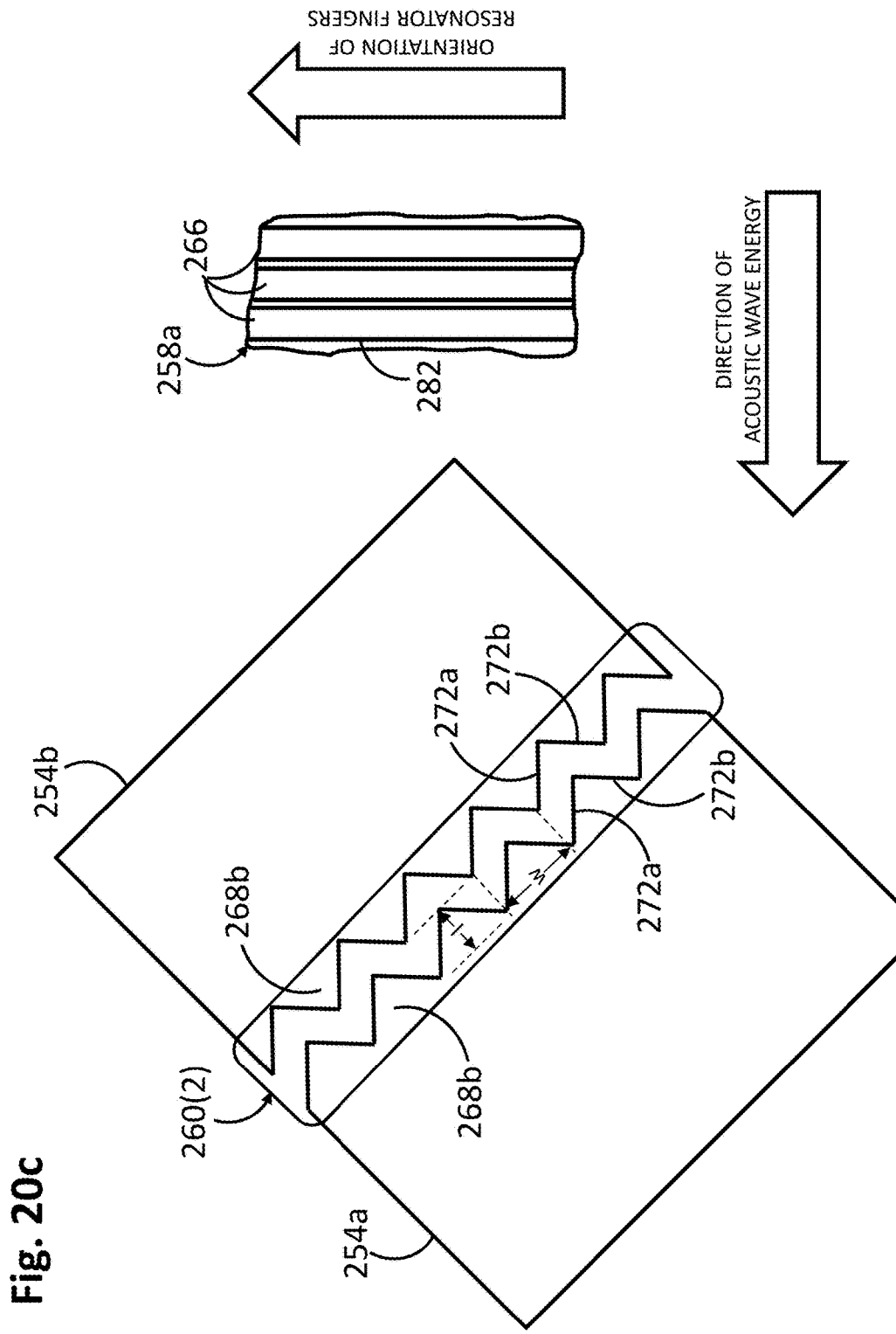

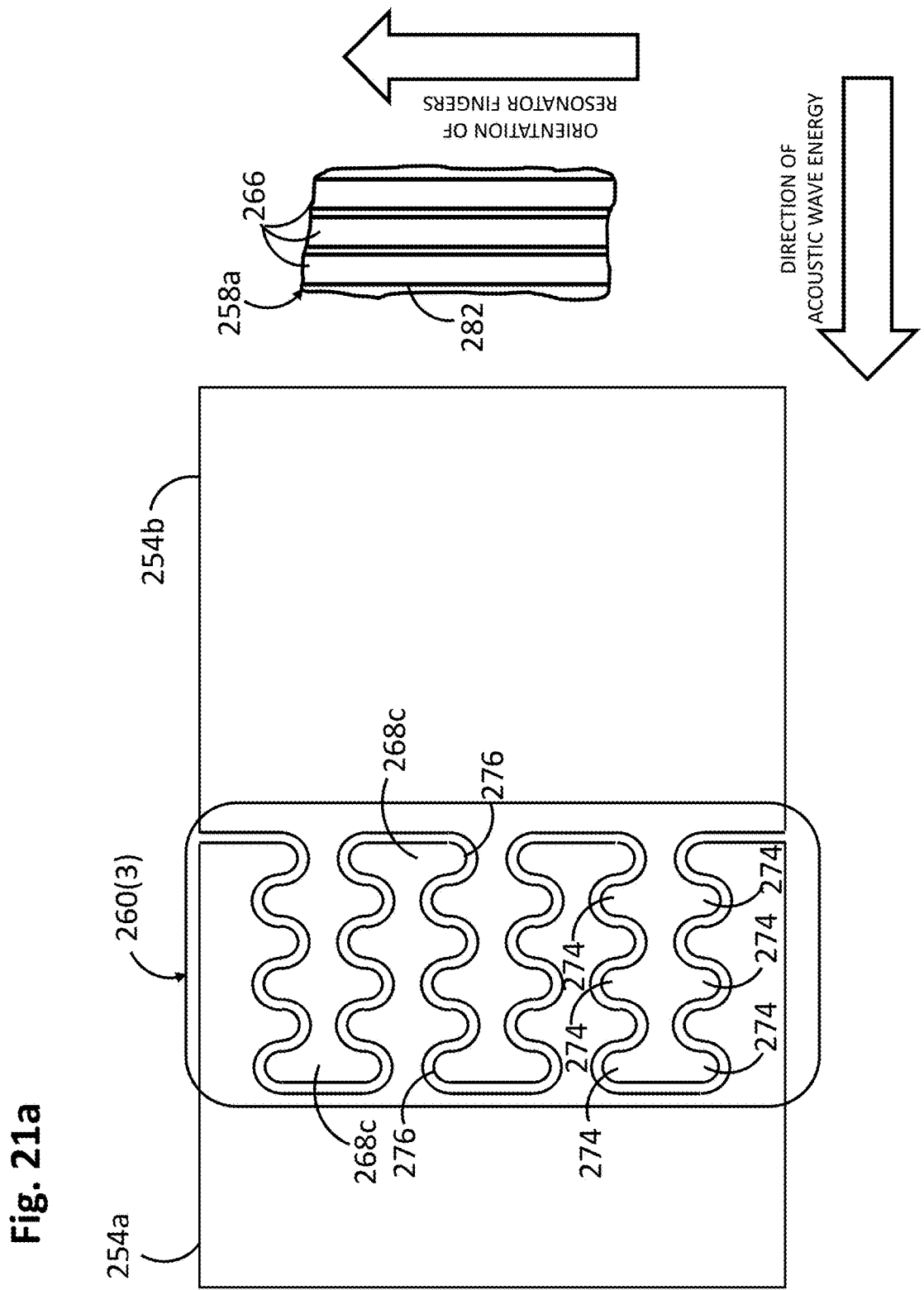

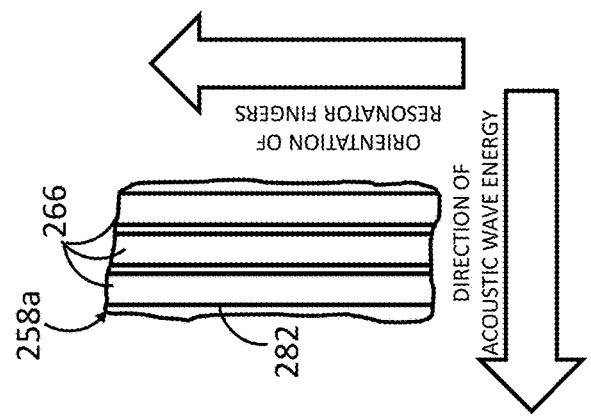
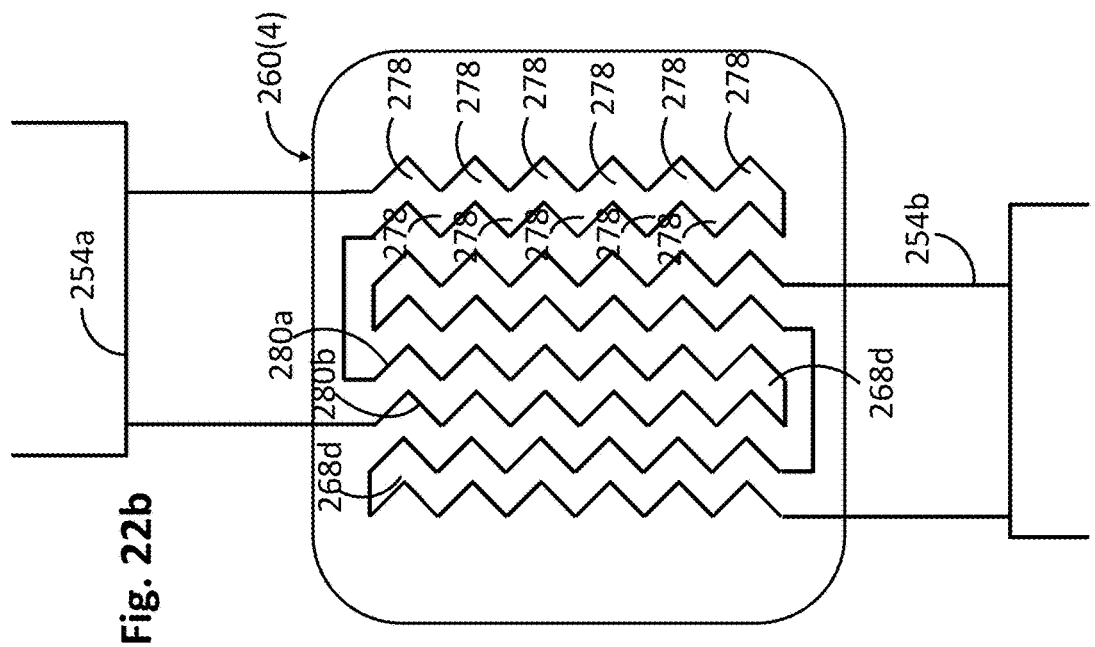
Fig. 22b

ACOUSTIC WAVE FILTER WITH ENHANCED REJECTION

RELATED APPLICATION DATA

The present application is a continuation-in-part of U.S. patent application Ser. No. 14/941,451, filed Nov. 13, 2015, which is expressly incorporated by reference into the present application in its entirety.

FIELD OF THE INVENTION

The present inventions generally relate to microwave filters, and more particularly, to acoustic wave filters designed for high frequency-selectivity applications.

BACKGROUND OF THE INVENTION

Electrical filters have long been used in the processing of electrical signals. In particular, such electrical filters are used to select desired electrical signal frequencies from an input signal by passing the desired signal frequencies, while blocking or attenuating other undesirable electrical signal frequencies. Filters may be classified in some general categories that include low-pass filters, high-pass filters, band-pass filters, and band-stop filters, indicative of the type of frequencies that are selectively passed by the filter. Further, filters can be classified by type, such as Butterworth, Chebyshev, Inverse Chebyshev, and Elliptic, indicative of the type of bandshape frequency response (frequency cutoff characteristics) the filter provides relative to the ideal frequency response.

The type of filter used often depends upon the intended use. In communications applications, radio frequency (RF) filters are conventionally used in telecommunications systems where information is transmitted over wireless links, for example, in the RF front-ends of base stations, mobile devices, satellite transceivers and ground receivers, Internet of Things (IOT) devices, laptop computers and tablets, fixed point links, and other similar systems, to filter out or block RF signals in all but one or more predefined bands. Of most particular importance is the frequency range from approximately 500-3,500 MHz. In the United States, there are a number of standard bands used for cellular communications. These include Band 2 (~1800-1900 MHz), Band 4 (~1700-2100 MHz), Band 5 (~800-900 MHz), Band 13 (~700-800 MHz), and Band 17 (~700-800 MHz); with other bands emerging.

RF filters typically require many design trade-offs to achieve the best compromise for a specific application in such performance parameters as insertion loss, rejection, isolation, power handling, linearity, as well as size and cost. Specific design and manufacturing methods and enhancements can benefit simultaneously one or several of these requirements. Performance enhancements to the RF filters in a telecommunications system can have broad impact to system performance. Improvements realized can come in several ways: cell size, battery life, data rates, network capacity, cost, security, reliability, etc. These improvements can be realized at many levels of the wireless system both separately and in combination, for example, at the RF module, RF transceivers, mobile or fixed sub-system, or network levels.

RF filters are generally built using two circuit building blocks: a plurality of resonators, which store energy very efficiently at a resonant frequency (which may be a fundamental resonant frequency $f_0$ or any one of a variety of higher order resonant frequencies $f_1$-$f_n$); and couplings, which couple electromagnetic energy between the resonators to form multiple reflection zeros providing a broader spectral response. For example, a four-resonator filter may include four reflection zeros. The strength of a given coupling is determined by its reactance (i.e., inductance and/or capacitance). The relative strengths of the couplings determine the filter shape, and the topology of the couplings determines whether the filter performs a band-pass or a band-stop function. The resonant frequency $f_0$ is largely determined by the inductance and capacitance of the respective resonator. For conventional filter designs, the frequency at which the filter is active is determined by the resonant frequencies of the resonators that make up the filter. Each resonator must have very low internal resistance to enable the response of the filter to be sharp and highly selective for the reasons discussed above. This requirement for low resistance tends to drive the size and cost of the resonators for a given technology.

The duplexer, a specialized kind of filter is a key component in the front-end of mobile devices. Modern mobile communications devices transmit and receive at the same time (using LTE, WCDMA or CDMA) and use the same antenna. The duplexer separates the transmit signal, which can be up to 0.5 Watt power, from the receive signal, which can be as low as a pico-Watt. The transmit and receive signals are modulated on carriers at different frequencies allowing the duplexer to select them, even so the duplexer must provide the frequency selection, isolation and low insertion loss in a very small size often only about two millimeters square.

The front-end receive filter preferably takes the form of a sharply defined band-pass filter to eliminate various adverse effects resulting from strong interfering signals at frequencies near the desired received signal frequency. Because of the location of the front-end receiver filter at the antenna input, the insertion loss must be very low so as to not degrade the noise figure. In most filter technologies, achieving a low insertion loss requires a corresponding compromise in filter steepness or selectivity.

In practice, most filters for cell phone handsets are constructed using acoustic resonator technology, such as surface acoustic wave (SAW), bulk acoustic wave (BAW), and film bulk acoustic resonator (FBAR) technologies. The equivalent circuit of an acoustic resonator has two resonances closely spaced in frequency called the "resonance" frequency and the "anti-resonance" frequency (see K. S. Van Dyke, Piezo-Electric Resonator and its Equivalent Network Proc. IRE, Vol. 16, 1928, pp. 742-764). Such acoustic resonator filters have the advantages of low insertion loss (on the order of 1 dB at the center frequency), compact size, and low cost compared to equivalent inductor/capacitor resonators. For this reason, acoustic resonator implementations are often used for RF filtering applications in the front-end receive filter of mobile devices.

Acoustic resonators are typically arranged in a ladder topology (alternating series and shunt resonators) in order to create band pass filters. Acoustic ladder filters have been very successful for handset applications, with more than a billion units currently sold each year. However, the recent trend in wireless technology towards multifunctional devices and a more crowded electromagnetic spectrum requires filters for ever more bands with sharper line shapes, while simultaneously demanding reduction in the size, cost, and power consumption.

In addition to sharpening the line shapes of filter passbands, it is also desirable to ensure that discontinuities in the frequency response reside as far outside of the pass band as possible. For example, a typical acoustic resonator has a plurality of interdigitized fingers (e.g., 80-100 fingers) that reflect acoustic waves back and forth between the fingers. The frequency band over which the acoustic reflections between the fingers add in phase to create the resonance may be referred to as the "Bragg Band." A discontinuity feature in the frequency response occurs at the upper edge of the Bragg Band, i.e., the highest frequency at which the acoustic reflections add in phase. This Bragg resonance can distort the high side of the passband of the bandpass filter, resulting in excessive loss at these frequencies. Thus, because the performance of the filter may be compromised if this discontinuity feature falls within the passband, it is important to ensure that the discontinuity feature falls well outside of the passband of the filter.

SUMMARY OF THE INVENTION

In accordance with the present inventions, an acoustic filter comprises a piezoelectric layer, and an acoustic resonator structure monolithically disposed on the piezoelectric layer, and a lumped capacitive structure monolithically disposed on the piezoelectric layer and being electrically coupled (e.g., in parallel) to the acoustic resonator structure. The piezoelectric layer may be, e.g., a piezoelectric substrate or may be thin-film piezoelectric monolithically disposed on a non-piezoelectric substrate. The acoustic resonator structure comprises an arrangement of planar interdigitated resonator fingers, and the lumped capacitive structure comprises an arrangement of planar interdigitated capacitive fingers. The interdigitated capacitive fingers and interdigitated resonator fingers have orientations that are parallel, oblique, or orthogonal to each other.

In one embodiment, the acoustic filter further may further comprise a metalized signal plane monolithically disposed on the piezoelectric layer, and a metalized ground plane monolithically disposed on the piezoelectric layer. In this case, each of the acoustic resonator structure and the capacitive resonator structure is electrically coupled between the signal plane and the ground plane. The lumped capacitive structure may be least partially nested, and perhaps fully nested, within at least one of the signal plane and the ground plane. In another separate embodiment, the acoustic filter may further comprise a metalized input signal plane portion monolithically disposed on the piezoelectric layer, and a metalized output signal plane portion monolithically disposed on the piezoelectric layer. In this case, each of the acoustic resonator structure and the capacitive resonator structure is electrically coupled between the input signal plane portion and the output signal plane portion. The lumped capacitive structure may be least partially nested, and perhaps fully nested, within at least one of the input signal plane portion and the output signal plane portion.

In accordance with a first aspect of the present inventions, each of at least one, and perhaps all, of the interdigitated capacitive fingers has an edge that is entirely continuous. In one embodiment, the entirely continuous edge of each of the interdigitated capacitive finger(s) has one or more undulations (e.g., a single undulation or a plurality of undulations).

In accordance with a second aspect of the present inventions, the interdigitated capacitive fingers and interdigitated resonator fingers have orientations that are parallel to each other, but no finite portion of an entire edge along the length of each of at least one, and perhaps all, of the interdigitated capacitive fingers is parallel to any finite portions of entire edges along the lengths of the interdigitated resonator fingers. In one embodiment, the entire edge of each of the interdigitated capacitive finger(s) has one or more undulations (e.g., a single undulation or a plurality of undulations). In another separate embodiment, the entire edge of each of the interdigitated capacitive finger(s) has at least one sawtooth (e.g., a single sawtooth or a plurality of sawteeth).

In accordance with a third aspect of the present inventions, each of at least one, and perhaps all, of the interdigitated capacitive fingers comprises a plurality of interdigitated capacitive sub-fingers. In one embodiment, the plurality of interdigitated capacitive sub-fingers has an orientation that is orthogonal to the orientation of the interdigitated capacitive finger(s). In another embodiment, each of the sub-fingers has an edge that forms at least one undulation. In another separate embodiment, each of the sub-fingers has an edge that forms at least one sawtooth. In still another embodiment, no finite portion of an edge along the length of each of at least one of the interdigitated capacitive sub-fingers is parallel to any finite portions of edges along the lengths of the interdigitated resonator fingers.

In accordance with a fourth aspect of the present inventions, each of at least one of the interdigitated capacitive fingers has a length/width ratio of less than two, and preferably less than one. In one embodiment, each of the interdigitated capacitive finger(s) forms a single undulation. In another separate embodiment, each of the interdigitated capacitive finger(s) forms a single sawtooth.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 13a is a schematic diagram of a conventional single section band-pass acoustic filter circuit;

FIG. 13b is a schematic diagram illustrating the MBVD equivalent circuit of the conventional acoustic filter circuit of FIG. 13a;

FIGS. 14a-14c are frequency response plots of passbands of varying bandwidths;

FIG. 15 is a frequency response plot comparing the passbands of FIGS. 14a-14c;

FIG. 16b is a schematic diagram illustrating the MBVD equivalent circuit of the enhanced acoustic filter circuit of FIG. 16a;

FIG. 17a is a schematic diagram of an enhanced single section band-pass acoustic filter circuit, wherein a capacitive element is added in parallel with the in-line resonator;

FIG. 17b is a schematic diagram illustrating the MBVD equivalent circuit of the enhanced acoustic filter circuit of FIG. 17a;

FIG. 19b is a plan view of the embodiment of the lumped capacitive structure of FIG. 19a, particularly showing the lumped capacitive structure oriented parallel to the lumped resonant structure;

FIG. 19c is a plan view of the embodiment of the lumped capacitive structure of FIG. 19a, particularly showing the lumped capacitive structure oriented oblique to the lumped resonant structure;

FIG. 20b is a plan view of the embodiment of the lumped capacitive structure of FIG. 20a, particularly showing the lumped capacitive structure oriented parallel to the lumped resonant structure;

FIG. 20c is a plan view of the embodiment of the lumped capacitive structure of FIG. 20a, particularly showing the lumped capacitive structure oriented oblique to the lumped resonant structure;

FIG. 21a is a plan view of still another embodiment of a lumped capacitive structure that can be used in the acoustic filter of FIG. 5, particularly showing the lumped capacitive structure oriented orthogonal to the lumped resonant structure;

FIG. 22b is a plan view of the embodiment of the lumped capacitive structure of FIG. 22a, particularly showing the lumped capacitive structure oriented parallel to the lumped resonant structure.

DETAILED DESCRIPTION OF THE EMBODIMENTS

Figure 1:
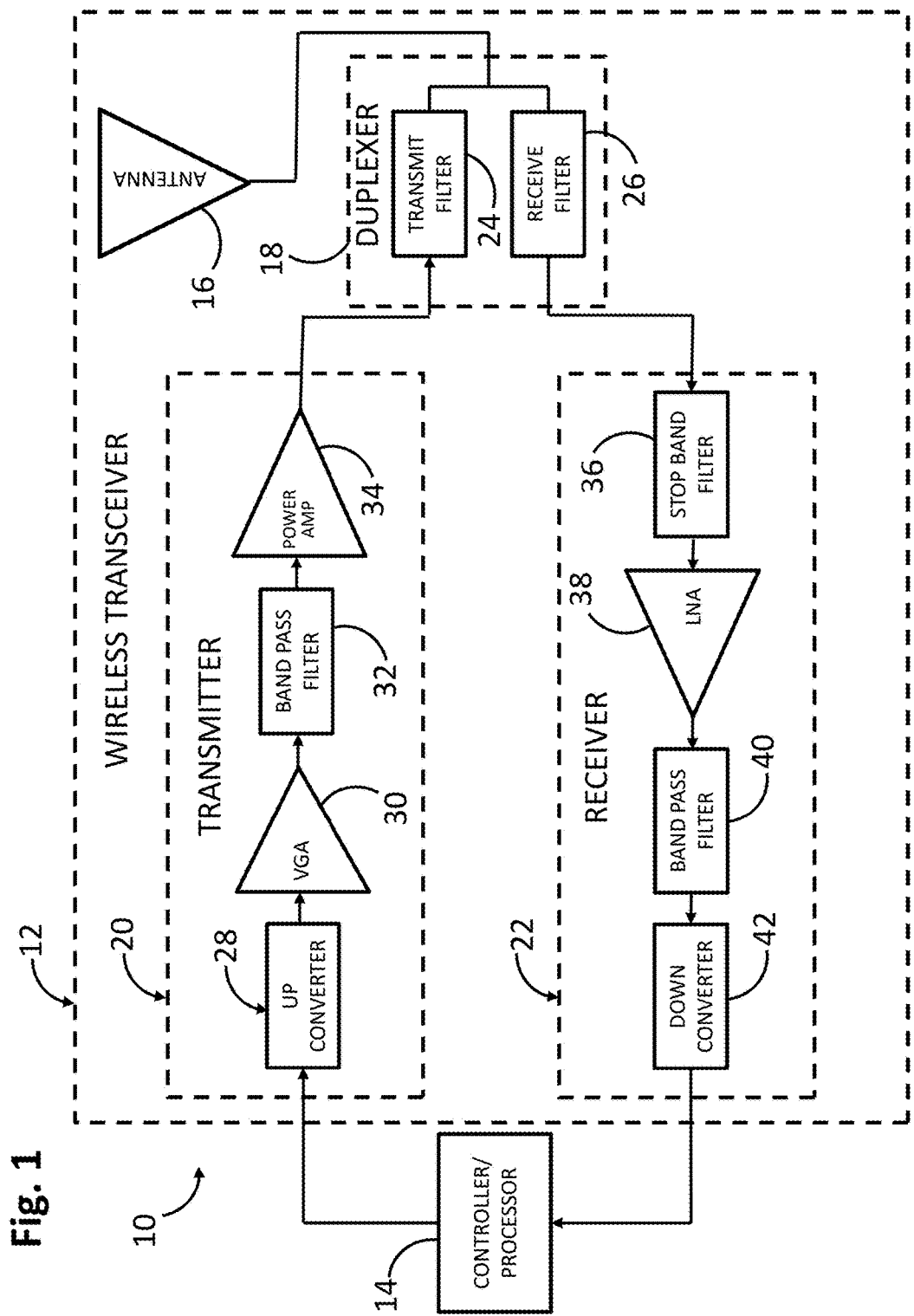
FIG. 1 is a block diagram of a wireless telecommunications system.

The present disclosure describes a design technique that enhances the rejection on one or both sides of a passband of an acoustic wave (AW) microwave filter, such as, e.g., a surface acoustic wave (SAW), bulk acoustic wave (BAW), film bulk acoustic resonator (FBAR), or microelectromechanical system (MEMS) filter. This technique uses standard manufacturing techniques and can be implemented without altering the overall size of the chip on which the microwave filter is disposed. This technique can be very useful when implemented in band gap contiguous duplexers. Increased rejection is also achieved in the neighboring band. Frequencies further out-of-band, both above and below the passband, can be rejected more, which will help in preventing unwanted signals interfering with the performance of the front-end receiver. Narrow band filters/duplexers can be designed, which increases the number of designs possible for a given piezoelectric material. The acoustic microwave filter may operate at microwave frequencies in the range of 300 MHz to 300 GHz, but is most applicable at frequencies in the range of 300 MHz to 10 GHz, and most particularly, at frequencies in the range of 500 MHz to 3.5 GHz.

The AW microwave filter described herein exhibits a frequency response with a single passband, which is particularly useful in telecommunication system duplexers where a passband with a closely spaced stopband is required. For example, with reference to FIG. 1, a telecommunications system 10 for use in the front-end of devices that transmit or receive information over wireless links, such as, e.g., base stations, mobile devices, satellite transceivers and ground receivers, Internet of Things (IOT) devices, laptop computers and tablets, fixed point links, and other similar systems. The telecommunications system 10 may include a transceiver 12 capable of transmitting and receiving wireless signals, and a controller/processor 14 capable of controlling the functions of the transceiver 12. The transceiver 12 generally comprises a broadband antenna 16, a duplexer 18 having a transmit filter 24 and a receive filter 26, a transmitter 20 coupled to the antenna 16 via the transmit filter 24 of the duplexer 18, and a receiver 22 coupled to the antenna 16 via the receive filter 26 of the duplexer 18.

The transmitter 20 includes an upconverter 28 configured for converting a baseband signal provided by the controller/processor 14 to a radio frequency (RF) signal, a variable gain amplifier (VGA) 30 configured for amplifying the RF signal, a bandpass filter 32 configured for outputting the RF signal at an operating frequency selected by the controller/processor 14, and a power amplifier 34 configured for amplifying the filtered RF signal, which is then provided to the antenna 16 via the transmit filter 24 of the duplexer 18.

The receiver 22 includes a notch or stopband filter 36 configured for rejecting transmit signal interference from the RF signal input from the antenna 16 via the receiver filter 26, a low noise amplifier (LNA) 38 configured for amplifying the RF signal from the stop band filter 36 with a relatively low noise, a tunable bandpass filter 40 configured for outputting the amplified RF signal at a frequency selected by the controller/processor 14, and a downconverter 42 configured for downconverting the RF signal to a baseband signal that is provided to the controller/processor 14. Alternatively, the function of rejecting transmit signal interference performed by the stop-band filter 36 can instead be performed by the duplexer 18. Or, the power amplifier 34 of the transmitter 20 can be designed to reduce the transmit signal interference.

It should be appreciated that the block diagram illustrated in FIG. 1 is functional in a nature, and that several functions can be performed by one electronic component or one function can be performed by several electronic components. For example, the functions performed by the up converter 28, VGA 30, bandpass filter 40, downconverter 42, and controller/processor 14 are oftentimes performed by a single transceiver chip. The function of the bandpass filter 32 can be into the power amplifier 34 and the transmit filter 24 of the duplexer 18.

The exemplary design techniques described herein are used to design acoustic microwave filters for the front-end of the telecommunications system 10, and in particular, the transmit filter 24 of the duplexer 18, although the same techniques can be used to design acoustic microwave filters for the receive filter 26 of the duplexer 18 and for other RF filters. Furthermore, although the exemplary design techniques are described herein for use in the front-end of the telecommunications system 10, such exemplary design techniques can be used in other systems, such as radio and electronic and information warfare systems.

Figure 2:
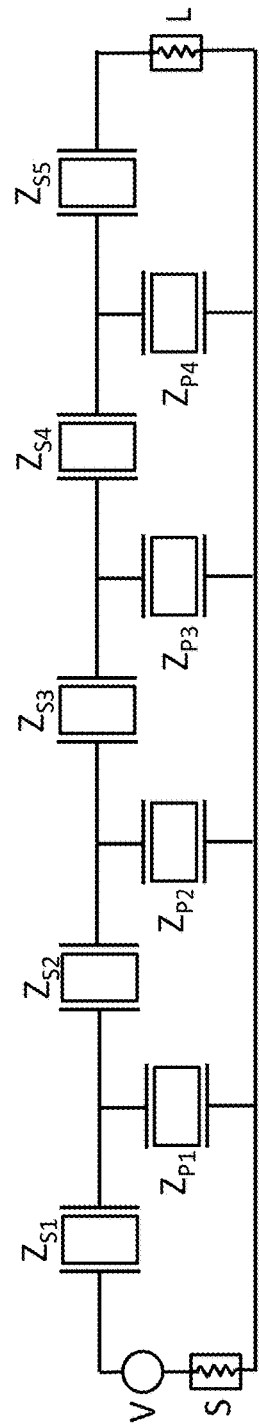
FIG. 2 is a schematic diagram of a conventional microwave acoustic filter arranged in an Nth order ladder topology.

Referring now to FIG. 2, one embodiment of a conventional band pass filter 100 will be described. The filter 100 is arranged in an Nth-order ladder topology (i.e., in this case, N=9 meaning the number of resonators equals 9). The filter 100 comprises a voltage source V, a source resistance S, a load resistance L, five series (or in-line) acoustic resonators $Z_{S1}$-$Z_{S5}$, and four parallel (or in-shunt) acoustic resonators $Z_{P1}$-$Z_{P4}$.

Figure 3:
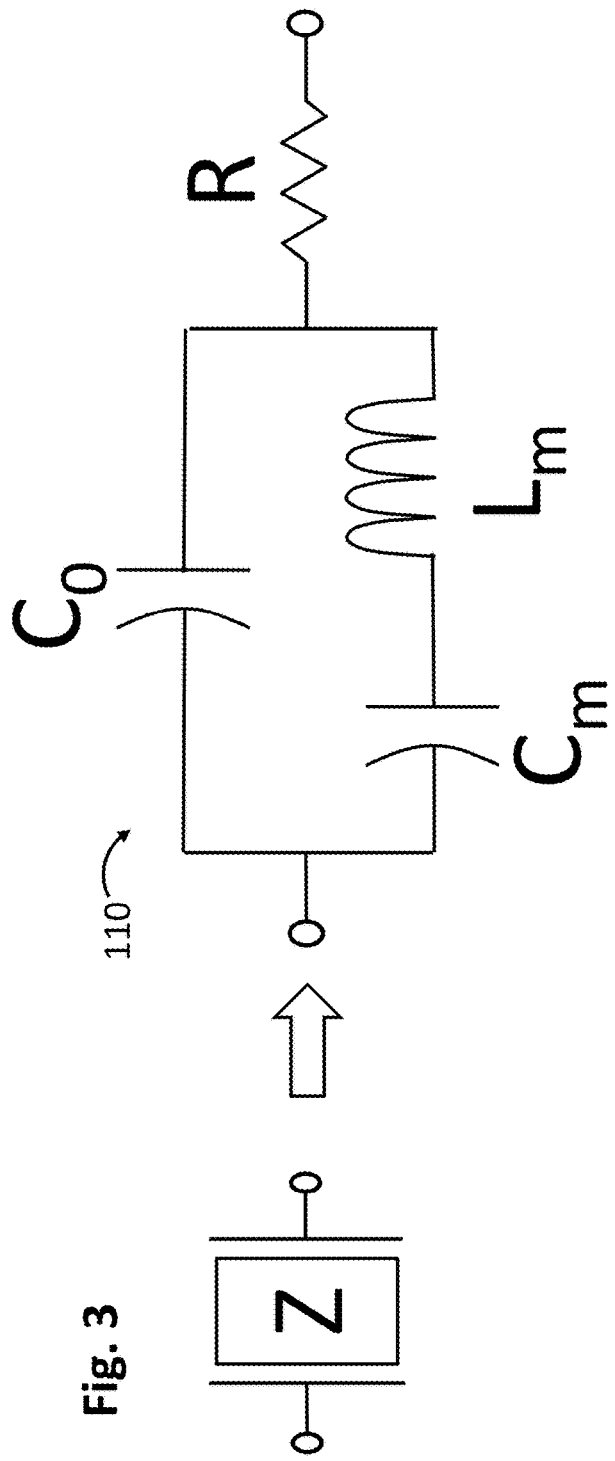
FIG. 3 is a schematic diagram illustrating the transformation of an acoustic resonator of the acoustic filter of FIG. 2 into an equivalent modified Butterworth-Van Dyke (MBVD) model.

Referring to FIG. 3, each of the acoustic resonators Z may be described by a modified Butterworth-Van Dyke (MBVD) model 110. MBVD models 110 may also describe SAW resonators, which may be fabricated by disposing interdigital transducers (IDTs) on a piezoelectric substrate, such as crystalline Quartz, Lithium Niobate ($LiNbO_3$), Lithium Tantalate ($LiTaO_3$) crystals or BAW (including FBAR) resonators or MEMS resonators. Each MBVD model 110 includes a motional capacitance $C_m$, a static capacitance $C_0$, a motional inductance $L_m$, and a resistance R. The motional capacitance $C_m$ and motional inductance $L_m$ may result from the interactions of electrical and acoustical behavior, and thus, may be referred to as the motional arm of the MBVD model. The static capacitance $C_0$ may result from the capacitance of the structure, and thus, may be referred to as the static (non-motional) capacitance of the MBVD model. The resistance R may result from the electrical resistance of the acoustic resonator.

Figure 4:
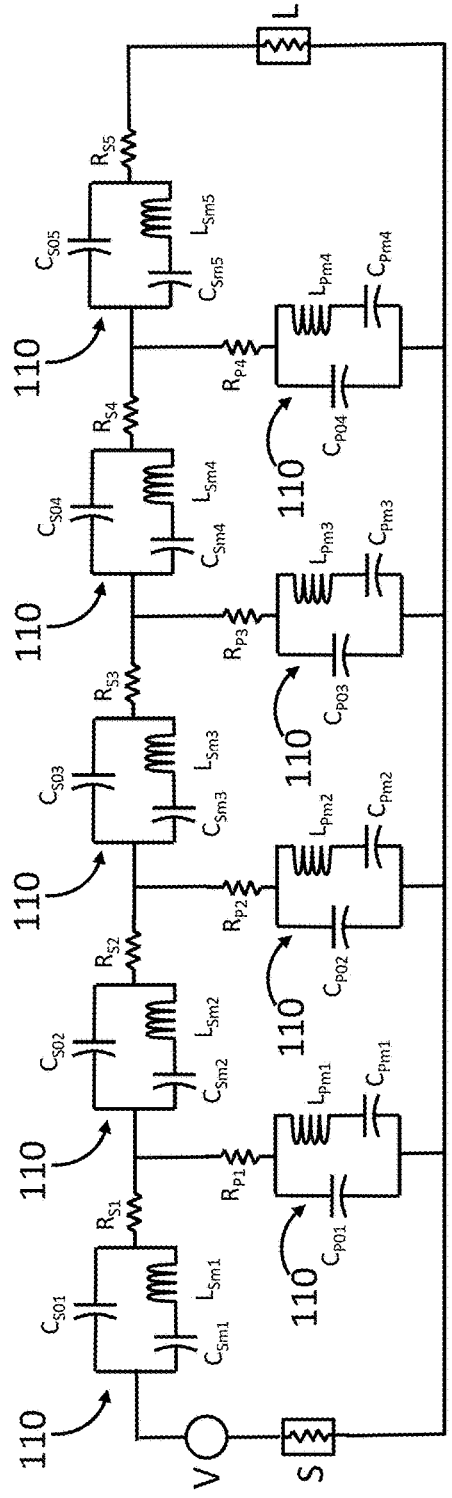
FIG. 4 is a schematic diagram illustrating the MBVD equivalent circuit of the conventional acoustic filter of FIG. 2.
Figure 5:
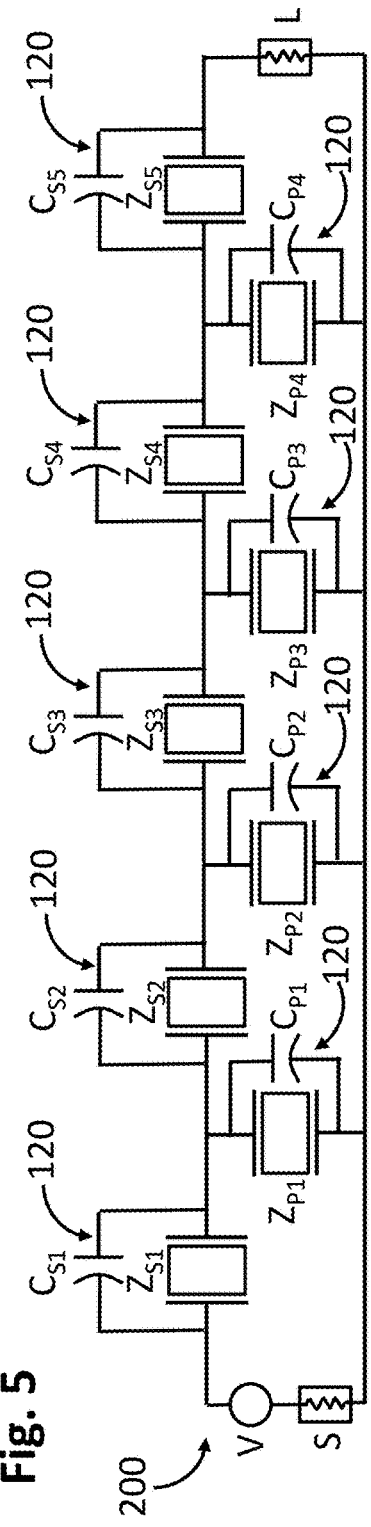
FIG. 5 is a schematic diagram illustrating an enhanced microwave acoustic filter constructed in accordance with one embodiment of the present inventions.
Figure 6:
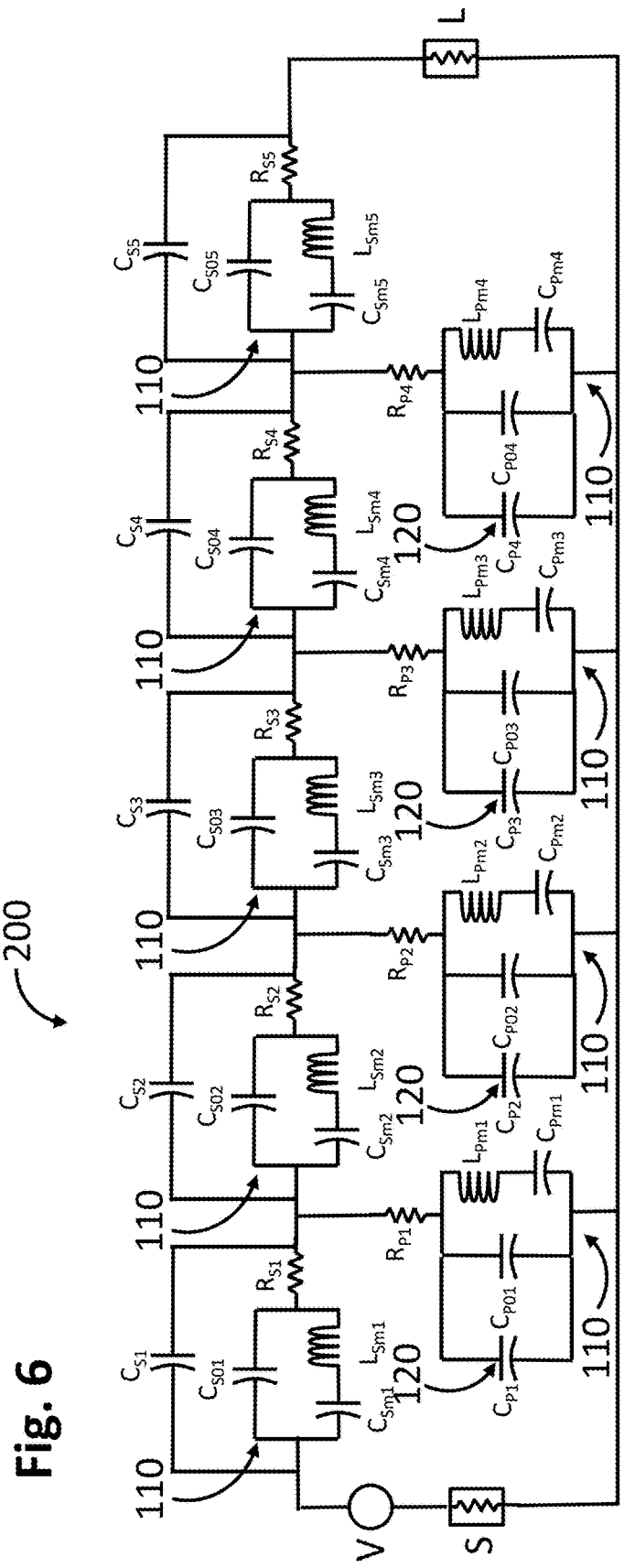
FIG. 6 is a schematic diagram illustrating the MBVD equivalent circuit of the enhanced acoustic filter of FIG. 5.

Referring to FIG. 4, each of the acoustic resonators Z of the conventional filter 100 can be replaced with the MBVD model 110 illustrated in FIG. 3. Significant to the present inventions, it has been discovered that the in-band and out-of-band rejection of the conventional band-pass filter 100 can be significantly improved by adding at least one capacitive element in parallel with at least one of the acoustic resonators 110. For example, as illustrated in FIG. 5, an embodiment of an enhanced band-pass filter 200 with improved in-band and out-of-band rejection is similar to the conventional band-pass filter 100, with the exception that the enhanced band-pass filter 200 comprises a plurality of additional capacitive elements 120 ($C_{S1}$-$C_{S5}$ and $C_{P1}$-$C_{P4}$), each of which is in parallel with a respective one of the acoustic resonators ($Z_{S1}$-$Z_{S5}$ and $Z_{P1}$-$Z_{P4}$). Each of the capacitive elements 120 may, e.g., have a capacitance in the range of 0.5 pF-2.0 pF, specifically, in the range of 0.8 pF-1.5 pF, and more specifically, in the range of 0.9 pF-1.1 pF. Referring to FIG. 6, each of the acoustic resonators Z of the enhanced filter 200 can be replaced with the MBVD model 110 illustrated in FIG. 3.

Figure 7:
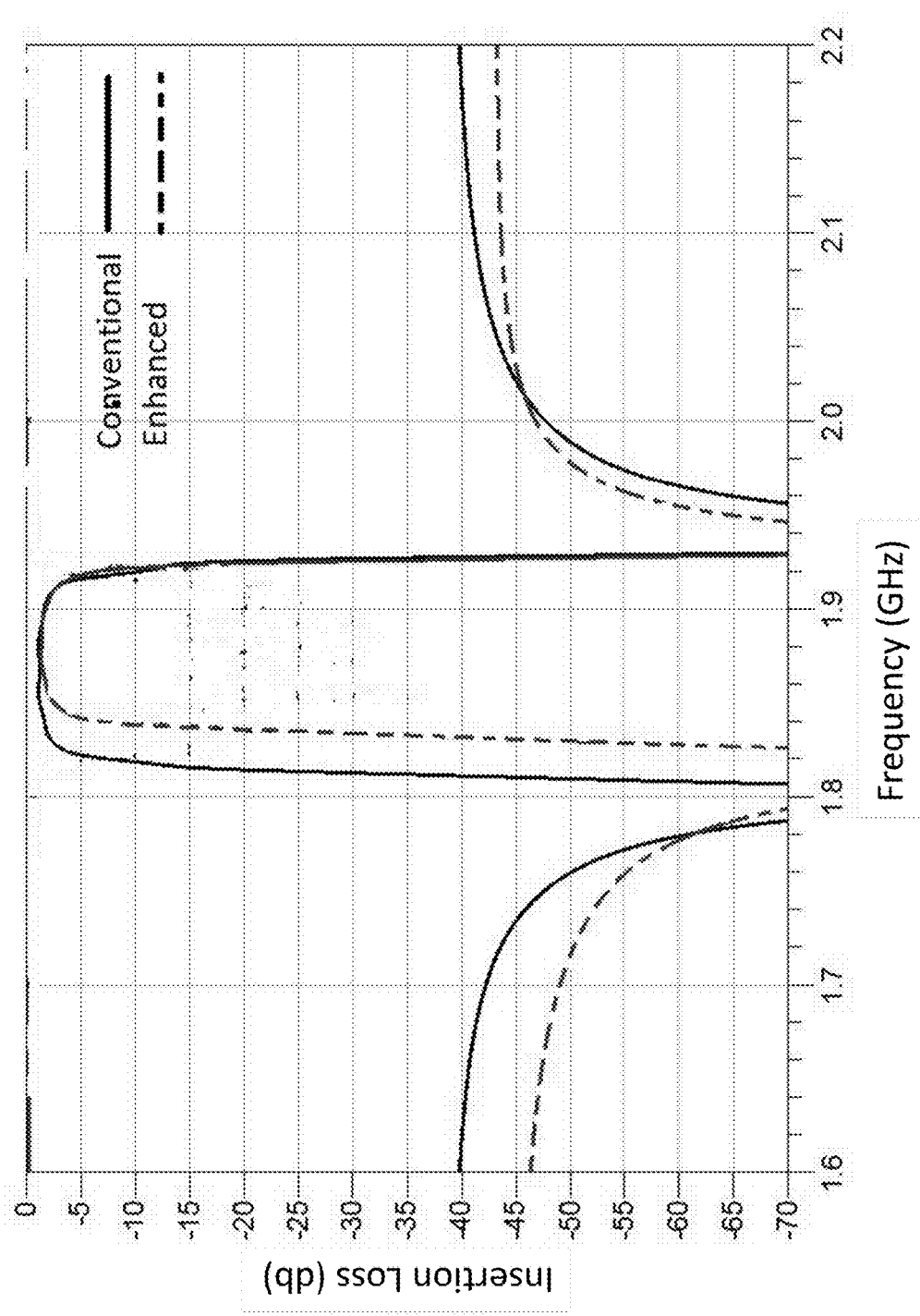
FIG. 7 is a frequency response plot comparing the passbands of the conventional acoustic filter of FIG. 3 and the enhanced acoustic filter of FIG. 5.
Figure 8:
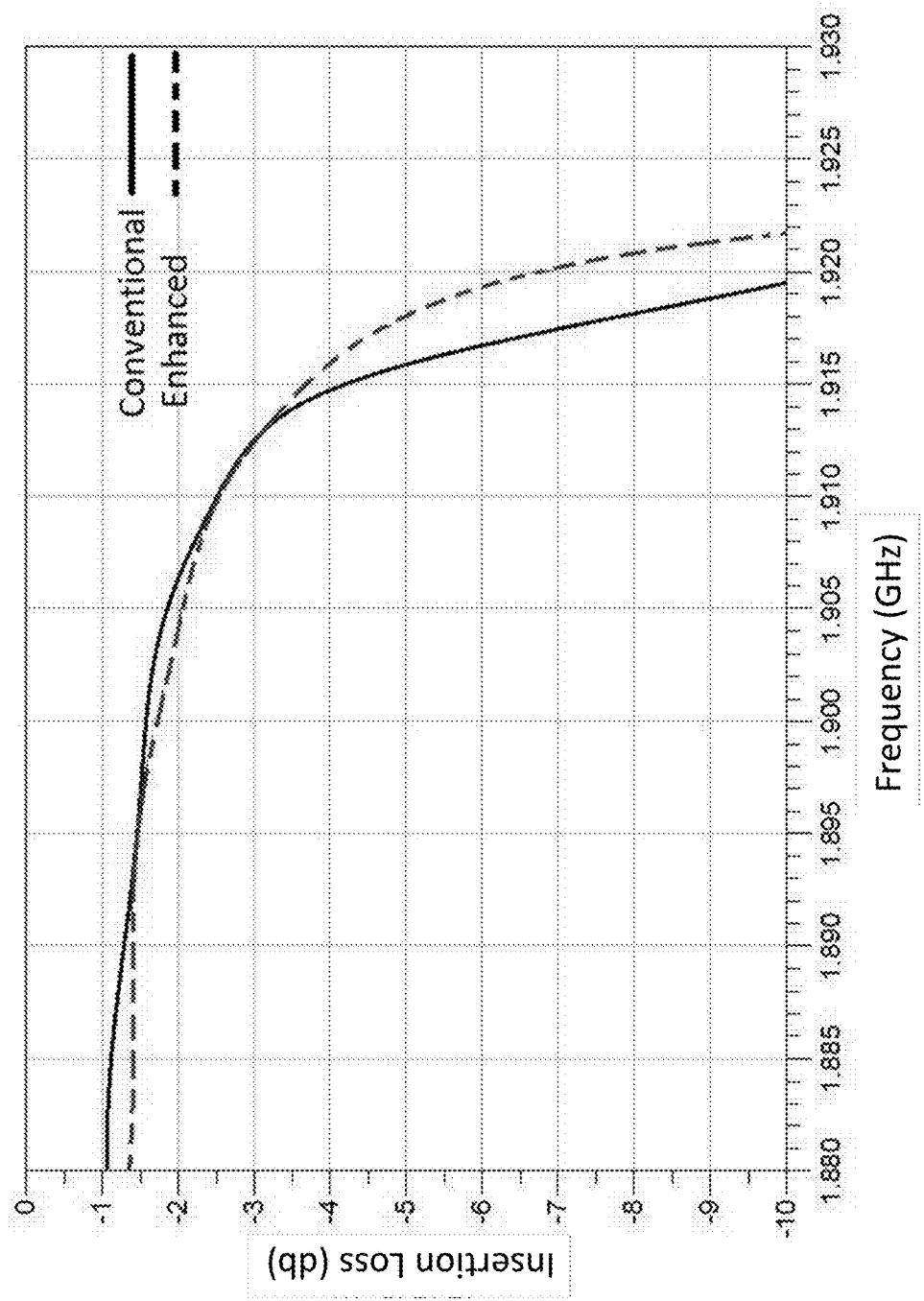
FIG. 8 is a frequency response plot comparing the upper edges of the passbands of the conventional acoustic filter of FIG. 3 and the enhanced acoustic filter of FIG. 5.
Figure 9:
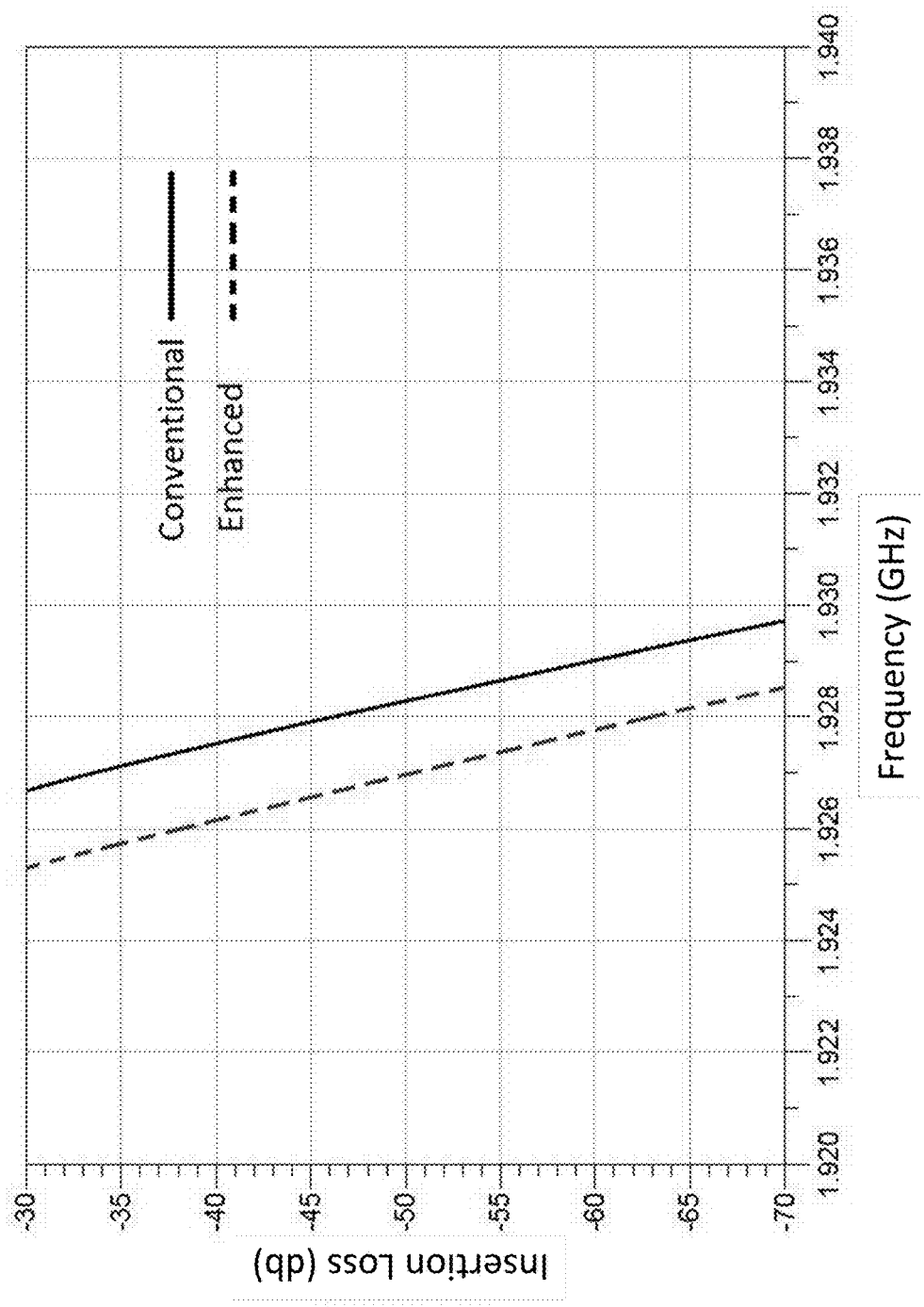
FIG. 9 is another frequency response plot comparing the upper edges of the passbands of the conventional acoustic filter of FIG. 3 and the enhanced acoustic filter of FIG. 5.
Figure 10:
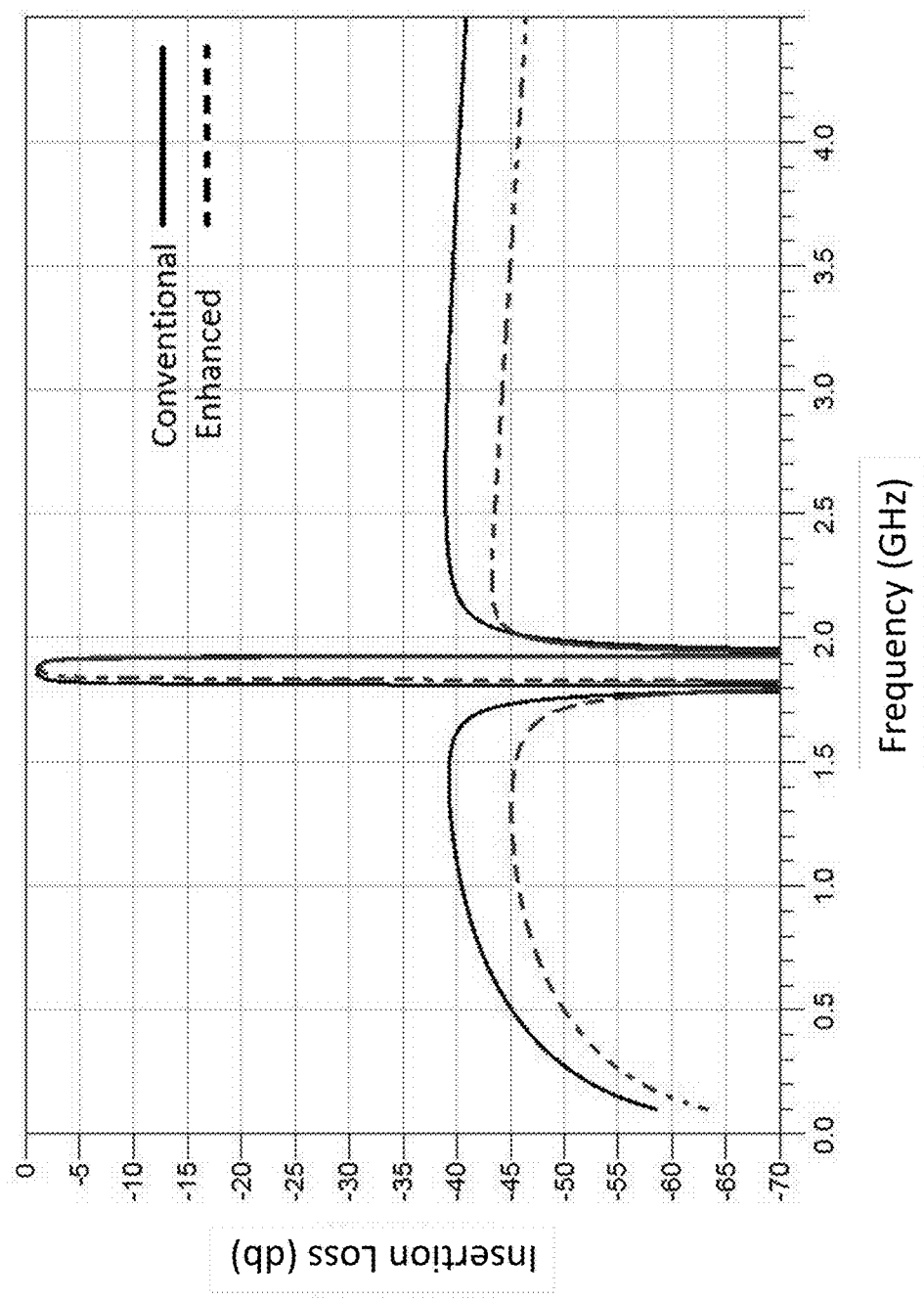
FIG. 10 is a frequency response plot comparing the out-of-band rejection of the conventional acoustic filter of FIG. 3 and the enhanced acoustic filter of FIG. 5.

As illustrated in FIG. 7, a simulated frequency response of the enhanced band-pass filter 200, where the values $C_{S1}$, $C_{S2}$, $C_{S3}$, $C_{S4}$, and $C_{S5}$ are set to 0.4 pF, and the values of $C_{P1}$, $C_{P1}$, $C_{P3}$, and $C_{P4}$ are set to 0.0 pF, can be compared to the simulated frequency response of the conventional band-pass filter 100 in terms of insertion loss $|S21|^2$. The enhanced frequency response has been aligned to the conventional acoustic filter at the upper −3 dB insertion loss point for comparison of the slopes at the upper sides of the passbands. As there shown, the lower edge of the passband of the enhanced band-pass filter 200 is sharper than the lower edge of the nominal passband of the conventional band-pass filter 100. As best illustrated in FIGS. 8 and 9, when the upper passband edges of the filters 100 and 200 are aligned at their respective −3 dB frequencies, it can be seen the enhanced filter 200 has improved rejection over that of the conventional filter 100 at the upper edge of the passband. As further shown in FIG. 10, the band-pass filter 200 has a substantially improved out-of-band rejection compared to that of the band-pass filter 100.

Figure 11A:
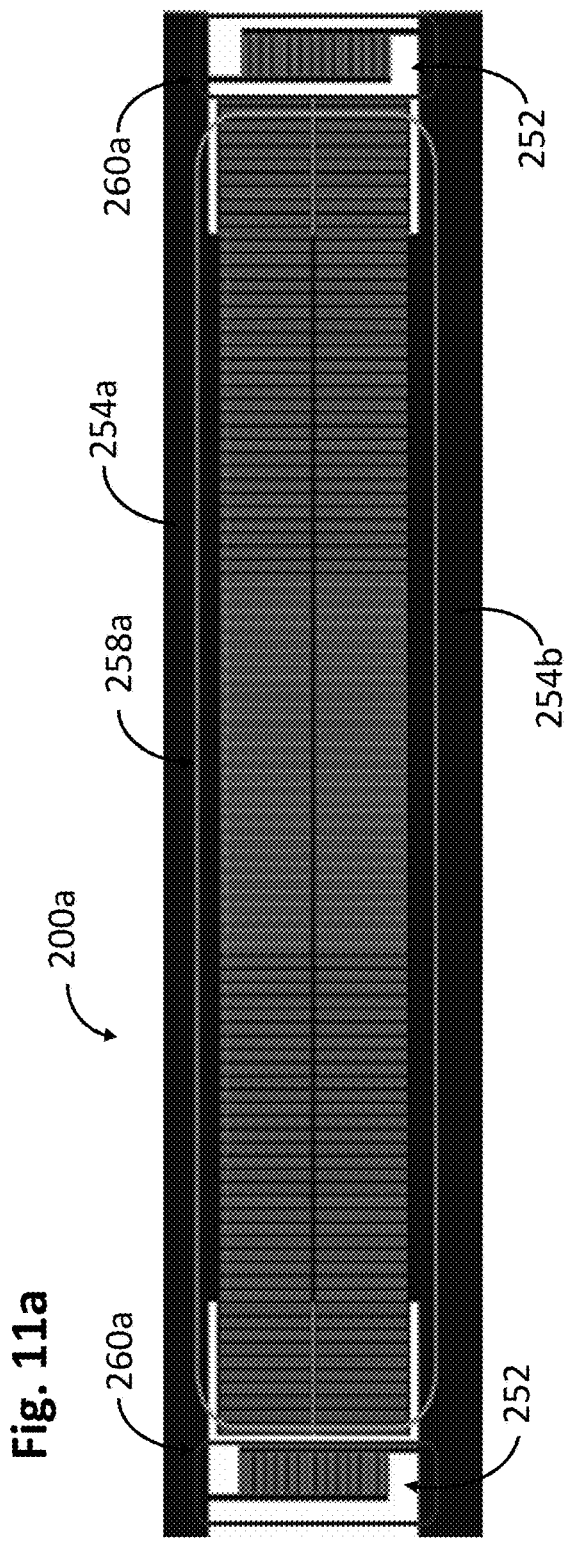
FIG. 11a is a plan view of an actual in-line acoustic resonator with additional capacitive elements fabricated for use in the enhanced acoustic filter of FIG. 5.
Figure 11B:
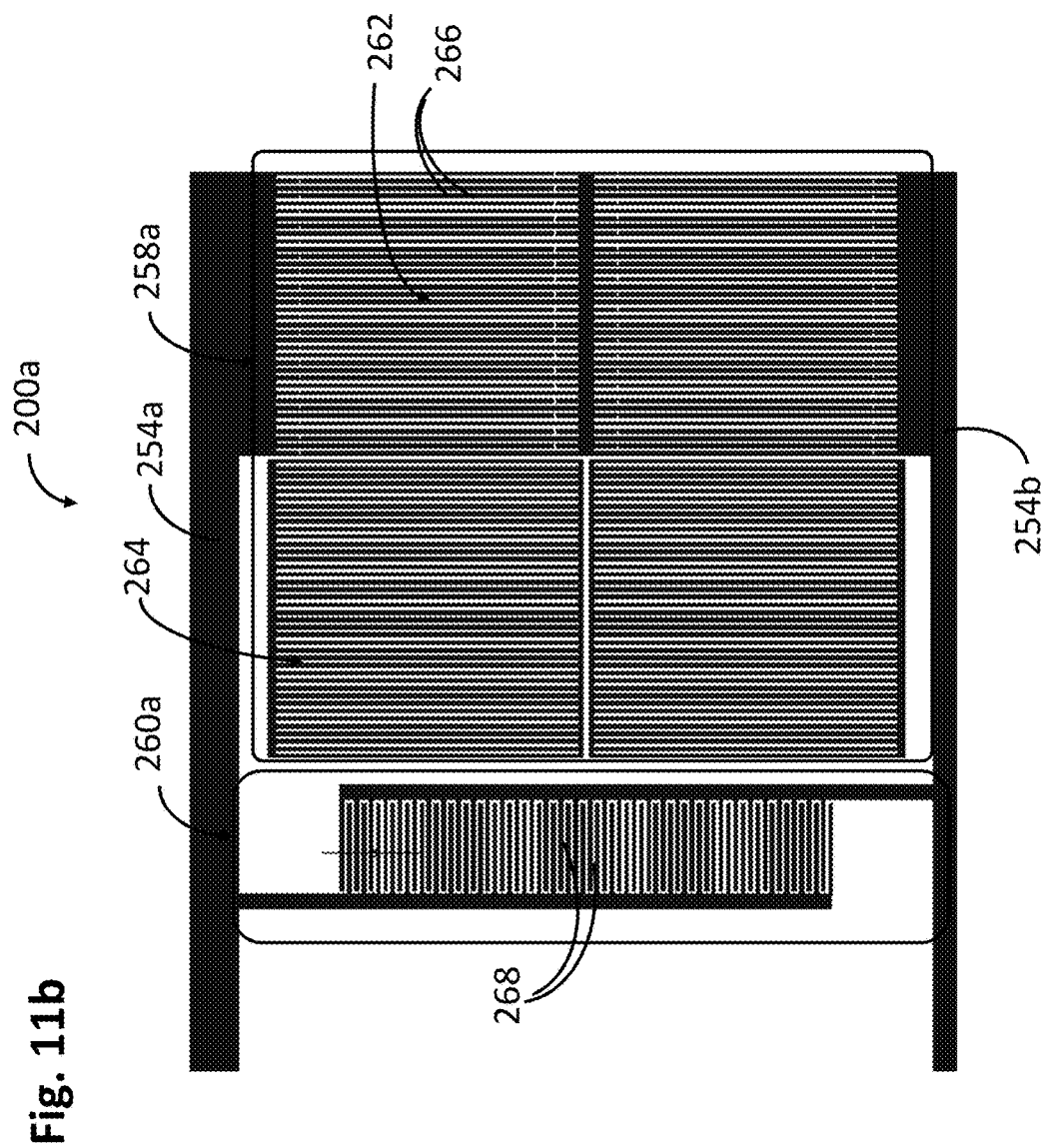
FIG. 11b is a plan view of a portion of the actual acoustic resonator of FIG. 11.

The capacitive elements 120 can be easily incorporated into an already existing conventional filter structure to create the band-pass filter 200. For example, as shown in FIGS. 11a and 11b, a portion of the filter 200a comprises a piezoelectric layer 252, and a metalized signal plane 254, acoustic resonator structure 258a, and a distinct lumped capacitive structure 260a all monolithically disposed on the piezoelectric layer 252. The piezoelectric layer 252 may be, e.g., a piezoelectric substrate or may be monolithically disposed on a non-piezoelectric substrate, e.g., as a thin-film piezoelectric. The signal plane 254 comprises an input signal plane portion 254a and an output signal plane portion 254b. The acoustic resonator structure 258a, which corresponds to one of the in-line resonators $Z_S$ in FIG. 5, is electrically coupled between the input signal plane portion 254a and the output signal plane portion 254b, and in the illustrated embodiment, is directly connected to the input signal plane portion 254a and output signal plane portion 254b. The acoustic resonator structure 258a comprises an interdigitated transducer (IDT) 262 formed by a plurality of interdigitated resonator fingers 266, for generating the acoustic waves, and an optional reflector 264 for reflecting the acoustic waves back into the IDT 262. The lumped capacitive structure 260 is shown coupled to both ends of the acoustic resonator structure 258a, and in particular, is directly electrically coupled between the input signal plane portion 254a and output signal plane portion 254b, and in the illustrated embodiment, is directly connected to the input signal plane portion 254a and output signal plane portion 254b. Similar to the IDT 262, the lumped capacitive structure 260a comprises a plurality of interdigitated capacitive fingers 268. However, the interdigitated capacitive fingers 268 are orthogonal to the interdigitated resonator fingers 266 to avoid excitation of acoustic waves.

Figure 12:
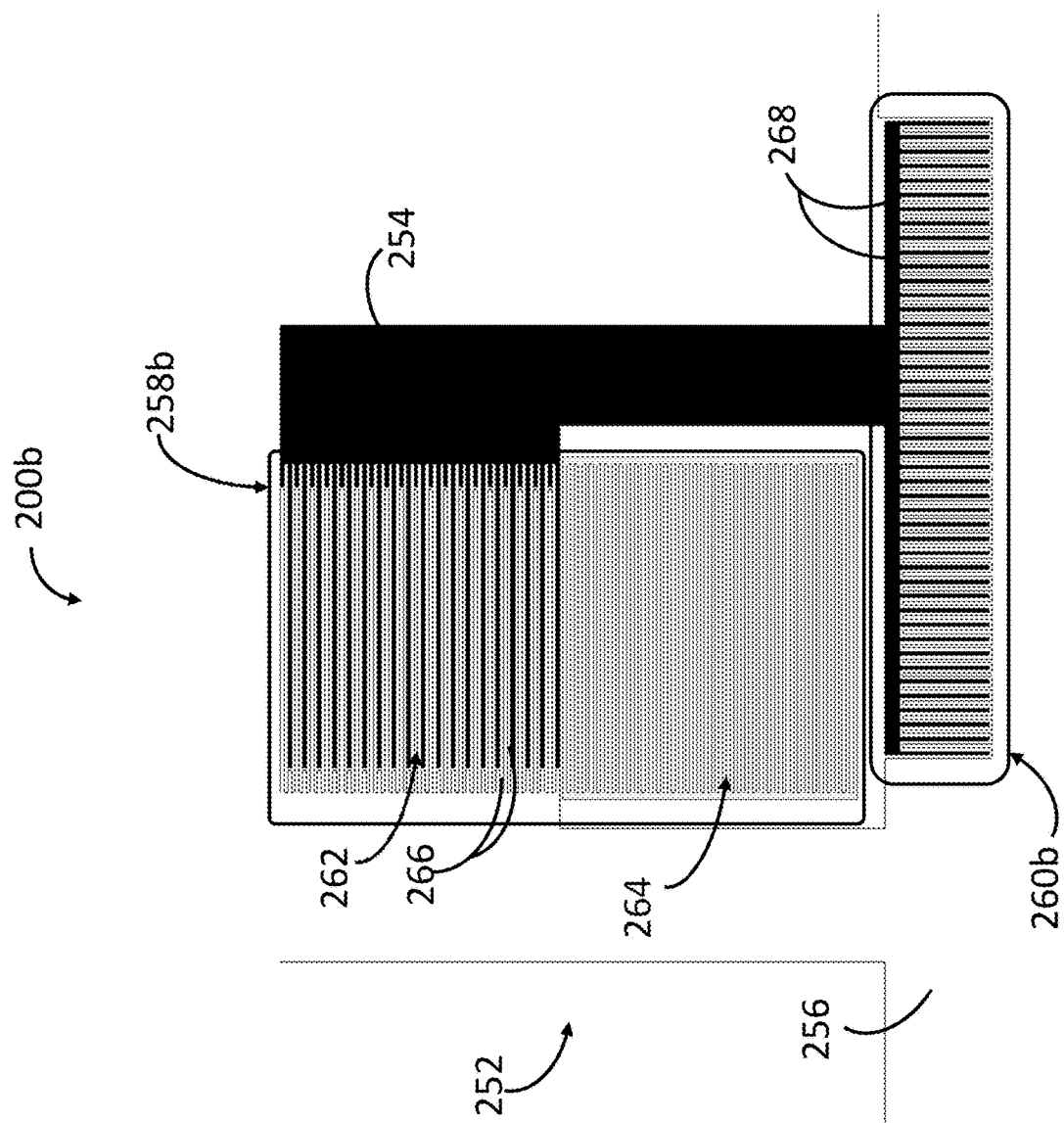
FIG. 12 is a plan view of an actual in-shunt acoustic resonator with an additional capacitive element fabricated for use in the enhanced acoustic filter of FIG. 5.

As another example, as shown in FIG. 12, another portion of the filter 200b comprises the piezoelectric layer 252 and the signal plane 254, a metallized ground plane 256, an acoustic resonator structure 258b, and a distinct lumped capacitive structure 260b all monolithically disposed on the piezoelectric layer 252. The acoustic resonator structure 258b, which corresponds to one of the in-shunt resonators $Z_P$ in FIG. 5, is electrically coupled between the signal plane 254 and the ground plane 256. Like the acoustic resonator structure 258a, the acoustic resonator structure 258b comprises an IDT 262 formed by a plurality of interdigitated resonator fingers 266, for generating the acoustic waves, and an optional reflector 264 for reflecting the acoustic waves back into the IDT 262. The lumped capacitive structure 260b is shown coupled to both ends of the acoustic resonator structure 258b, and in particular, is directly electrically coupled between the signal plane 254 and ground plane 256, and in the illustrated embodiment is directly connected to the signal plane 254 and ground plane 256. Similar to the IDT 262, the lumped capacitive structure 260b comprises a plurality of interdigitated capacitive fingers 268 that are orthogonal to the interdigitated resonator fingers 266 to avoid excitation of acoustic waves.

Significantly, although the lumped capacitive structure 260b can be connected some distance away from the signal plane 254 and ground plane 256, the interdigitated capacitive fingers 268 are at least partially nested within one or both of the signal plane 254 and ground plane 256 in order to utilize the limited space on the piezoelectric layer 252. In this manner, the lumped capacitive structure 260b can be more easily incorporated into an already existing filter layout. In the illustrated embodiment, the interdigitated capacitive fingers 268 are fully nested within the ground plane 256. In alternative embodiments, the interdigitated capacitive fingers 268 of the lumped capacitive structure 260a may be at least partially nested, and perhaps fully nested, within one or both of the input signal plane portion 254a and output signal plane portion 254b illustrated in FIG. 11b.

Referring to FIGS. 13-17, the theory supporting the improved out-of-band rejection of the band-pass filter 200 relative to that of the conventional band-pass filter 100 will now be described. Referring first to FIGS. 13a-13c, a conventional single section band-pass filter circuit 300 may have a single acoustic resonator pair 302 consisting of a series (or in-line) acoustic resonator $Z_S$ and a parallel (or in-shunt) acoustic resonator $Z_P$ (FIG. 13a). Four of such acoustic resonator pairs can be found in the conventional band-pass filter 100 or the enhanced band-pass filter 200. For example, the acoustic resonators pairs may be identified in the filters 100, 200 as the resonators $Z_{S1}/Z_{P1}$, $Z_{S2}/Z_{P2}$, $Z_{S3}/Z_{P3}$, and $Z_{S4}/Z_{P4}$, or as the resonators $Z_{P1}/Z_{S2}$, $Z_{P2}/Z_{S3}$, $Z_{P3}/Z_{S4}$, and $Z_{P4}/Z_{S5}$. As illustrated in FIG. 13b, each of the acoustic resonators Z of the filter circuit 300 can be replaced with the BVD model 100' (i.e., the MBVD model 110 illustrated in FIG. 3 without the resistance R) to create an equivalent filter circuit, and modeled to create a passband having the profile represented by the $|S21|^2$ frequency response illustrated in FIG. 13c.

Let the resonance and anti-resonance frequencies of the series resonator $Z_S$ be respectively designated as $\omega_{rs}$ and $\omega_{as}$, and the resonance and anti-resonance frequencies of each of the shunt resonator $Z_P$ be respectively designated as $\omega_{rp}$ and $\omega_{ap}$. When $\omega_{rs}$ and $\omega_{ap}$ are approximately equal to each other, reflection zeroes at $\omega=\omega_{rs}$, $\omega_{ap}$ defining a passband centered near $\omega=\omega_{rs}$, $\omega_{ap}$ are created, and transmission zeroes at $\omega=\omega_{rp}$, $\omega_{as}$ defining the passband edges are created. Transforming the frequencies $\omega$ from radians into Hertz yields $F_a=\omega_{rp}/2\pi$, $F_b=\omega_{rs}/2\pi$, $F_c=\omega_{ap}/2\pi$, and $F_d=\omega_{as}/2\pi$.

The parameters in the equivalent filter circuit 300 of FIG. 13b are related by the following equations:

$$\omega_r = \frac{1}{\sqrt{L_m C_m}}; \quad [1]$$

$$\frac{\omega_a}{\omega_r} = \sqrt{1 + \frac{1}{\gamma}}, \quad [2]$$

where $\omega_R$ and $\omega_A$ may be the respective resonance and anti-resonance frequencies for any given acoustic resonator, and gamma $\gamma$ may depend on a material's property, which may be further defined by:

$$\frac{C_0}{C_m} = \gamma. \quad [3]$$

It can be appreciated from equation [1] that the resonant frequency of each of the acoustic resonators will depend on the motional arm of the BVD model 110', whereas the filter characteristics (e.g., bandwidth) will be strongly influenced by $\gamma$ in equation [2]. The Quality factor (Q) for an acoustic resonator may be an important figure of merit in acoustic filter design, relating to the loss of the element within the filter. Q of a circuit element represents the ratio of the energy stored per cycle to the energy dissipated per cycle. The Q factor models the real loss in each acoustic resonator, and generally more than one Q factor may be required to describe the loss in an acoustic resonator. Q factors may be defined as follows for the filter examples. The motional capacitance $C_m$ may have an associated Q defined as $QC_m=10^8$; the static capacitance $C_0$ may have an associated Q defined as $QC_0=200$; and motional inductance $L_m$ may have an associated Q defined as $QL_m=1000$. Circuit designers may typically characterize SAW resonators by resonant frequency $\omega_R$, static capacitance $C_0$, gamma $\gamma$, and Quality factor $QL_m$. For commercial applications, $QL_m$ may be about 1000 for SAW resonators, and about 3000 for BAW resonators. Typical γ values may range from about 12 to about 18 for 42-degree X Y cut $LiTaO_3$.

Figure 13C:
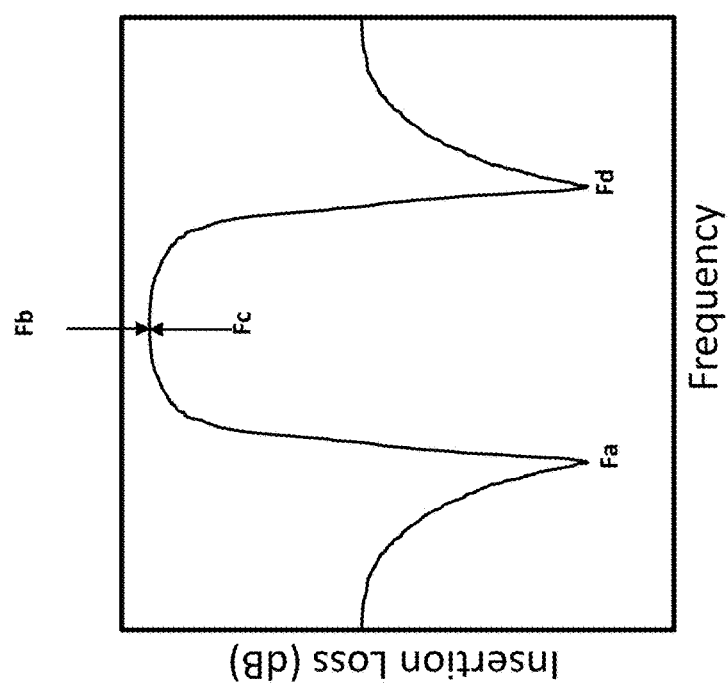
FIG. 13c is a frequency response plot of the passband of the conventional acoustic filter of FIG. 13b.

Using the standard resonance formula:

$$f = \frac{1}{2\pi\sqrt{LC}}, \qquad [4]$$

wherein f is the frequency in hertz, L is the inductance in henrys, and C is the capacitance in farads, the transmission zeroes and reflection zeroes of the equivalent filter circuit of FIG. 13c can be computed as follows. The transmission zero at the lower edge of the passband is effectively the resonance created by the circuit $L_{m1}$ and $C_{m1}$ (i.e., the resonance of the acoustic resonator $Z_P$) and is given by:

$$F_a = \frac{1}{2\pi\sqrt{L_{m1} \cdot C_{m1}}}. \qquad [5]$$

This resonance creates an effective short circuit to the return path and no power is transmitted from the input to the output of the filter. One reflection zero located in the passband is effectively the resonance created by the circuit $L_{m1}$, $C_{m1}$, and $C_{01}$ (i.e., the anti-resonance of the acoustic resonator $Z_P$) and is given by:

$$F_b = \frac{1}{2\pi\sqrt{\dfrac{L_{m1} \cdot C_{m1} \cdot C_{01}}{C_{m1} + C_{01}}}}. \qquad [6]$$

This resonance creates an effective open circuit to the return path, allowing power to be transmitted from the input to the output of the filter. The other reflection zero located in the passband is effectively the resonance created by the circuit $L_{m2}$ and $C_{m2}$ (i.e., the resonance of the acoustic resonator $Z_S$) and is given by:

$$F_c = \frac{1}{2\pi\sqrt{L_{m2} \cdot C_{m2}}}. \qquad [7]$$

This resonance creates an effective short circuit, allowing power to be transmitted from the input to the output of the filter. The transmission zero at the upper edge of the passband is effectively the resonance created by the circuit $L_{m2}$, $C_{m2}$, and $C_{02}$ (i.e., the anti-resonance of the acoustic resonator $Z_S$) and is given by:

$$F_d = \frac{1}{2\pi\sqrt{\dfrac{L_{m2} \cdot C_{m2} \cdot C_{02}}{C_{m2} + C_{02}}}}. \qquad [8]$$

This resonance creates an effective open circuit to the return path, preventing power from being transmitted from the input to the output of the filter.

Referring to FIG. 14a-14c, it can be seen that the bandwidths of acoustic filters 300a-300c are tightly coupled to the spacing between the frequencies $F_a$ and $F_b$ and the spacing between the frequencies $F_c$ and $F_d$. As can be appreciated from FIG. 15, a comparison of the frequency responses of these acoustic filters reveals that, as these spacings become larger, the relative bandwidths of acoustic filters increase and the slopes of the passbands of the acoustic filters become more shallow (see frequency response of the acoustic filter circuit 300c). In contrast, as these spacings become smaller, the relative bandwidths of these acoustic filters decrease and the slopes of the passbands of the acoustic filters become steeper (see frequency response of the acoustic filter circuit 300a).

Figure 16A:
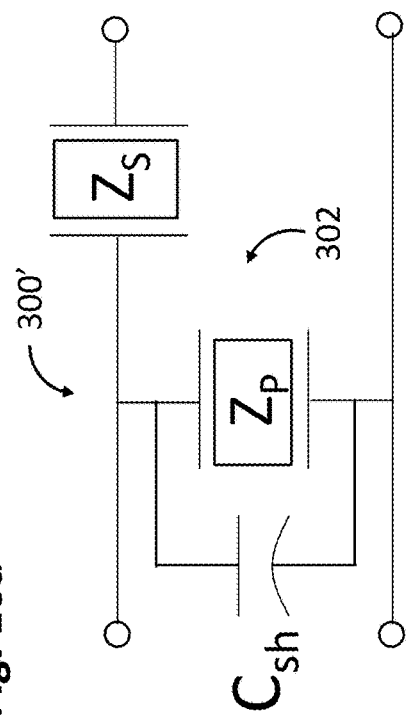
FIG. 16a is a schematic diagram of an enhanced single section band-pass acoustic filter circuit, wherein a capacitive element is added in parallel with the in-shunt resonator.
Figure 16B:
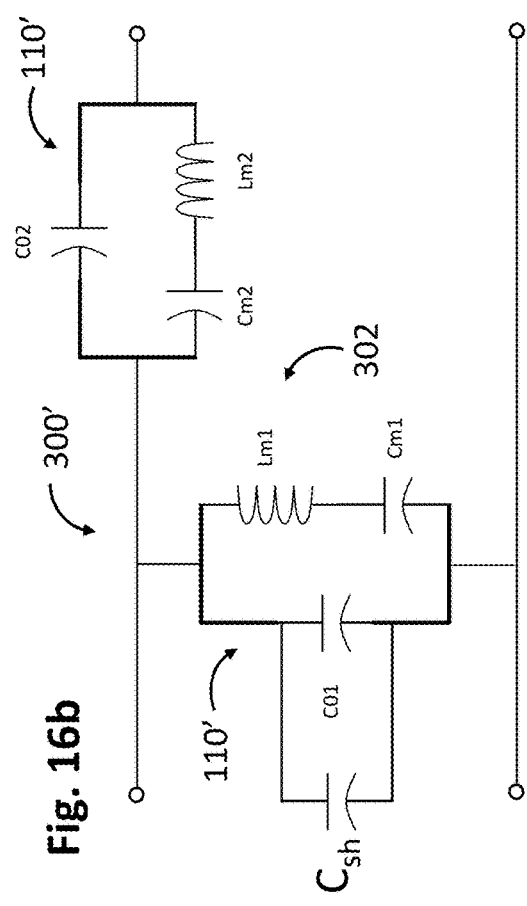
Figure 16C:
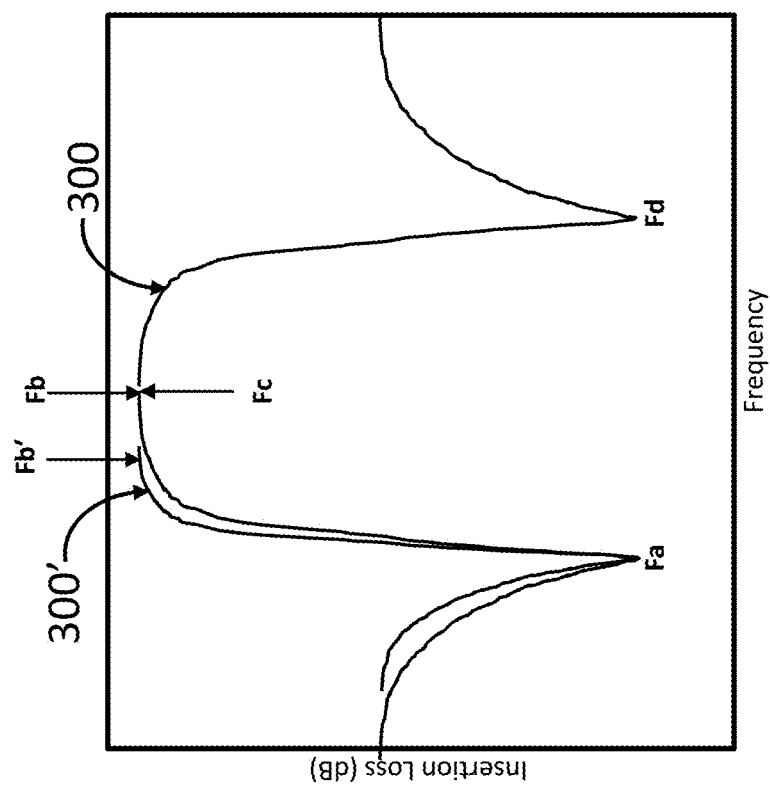
FIG. 16c is a frequency response plot of the passband of the enhanced acoustic filter of FIG. 16b.

Referring now to FIGS. 16a-16c, assume that a capacitance $C_{sh}$ is added in parallel with the shunt acoustic resonator $Z_P$ of the original filter circuit 300 (FIG. 16a), and the shunt acoustic resonator $Z_P$ is replaced with the BVD model 110' to create a new filter circuit 300' (FIG. 16b), which yields an $|S21|^2$ frequency response in comparison with the $|S21|^2$ frequency response of the original filter circuit 300 (FIG. 16c).

In the new filter circuit 300', the transmission zero located at the lower edge of the passband is effectively the resonance created by the circuit $L_{m1}$ and $C_{m1}$ (i.e., the resonance of the acoustic resonator $Z_P$). This transmission zero, therefore, remains unchanged with the addition of the capacitance $C_{sh}$, and is thus, located at the frequency $F_a$ given by equation [5] above. One reflection zero located in the passband is effectively the resonance created by the circuit $L_{m1}$ and $C_{m1}$ (i.e., the resonance of the acoustic resonator $Z_P$).

This transmission zero, therefore, remains unchanged with the addition of the capacitance $C_{sh}$, and is thus, located at the frequency $F_a$ given by equation [5] above. One reflection zero located in the passband is effectively the resonance created by the circuit $L_{m1}$, $C_{m1}$, and $C_{01}$ (i.e., the anti-resonance of the acoustic resonator $Z_P$) in parallel with the capacitance $C_{sh}$, and is given by:

$$F_b' = \frac{1}{2\pi\sqrt{\dfrac{L_{m1} \cdot C_{m1} \cdot (C_{01} + C_{sh})}{C_{m1} + C_{01} + C_{sh}}}}. \qquad [9]$$

The relationship between the reflection zero $F_b$ in equation [6] and the reflection zero $F_b'$ in equation [9] can be determined by assigning values to the lumped elements and solving equations [6] and [9]. Setting $L_{m1}=C_{m1}=C_{01}=1$, then $$F_b = \frac{k}{\sqrt{0.5}} \text{ and } F_b' = \frac{k}{\sqrt{\dfrac{1 + C_{sh}}{2 + C_{sh}}}},$$

where k is a constant. When $C_{sh}=0$, $F_b=F_b'$. For any positive values of $C_{sh}$, then $F_b'<F_b$.

As can be appreciated from the foregoing, the result of adding a capacitance $C_{sh}$ in parallel with the shunt resonator $Z_P$ does not affect the location of the transmission zero $F_a$, but causes the reflection zero $F_b$ to move down in frequency to $F_b'$. Because the filter match is affected (degraded), the transmission zero $F_a$ can be moved higher to return the filter match to its original response, which also narrows the filter bandwidth. The resulting filter has a steeper skirt on the lower side of the passband.

Figure 17C:
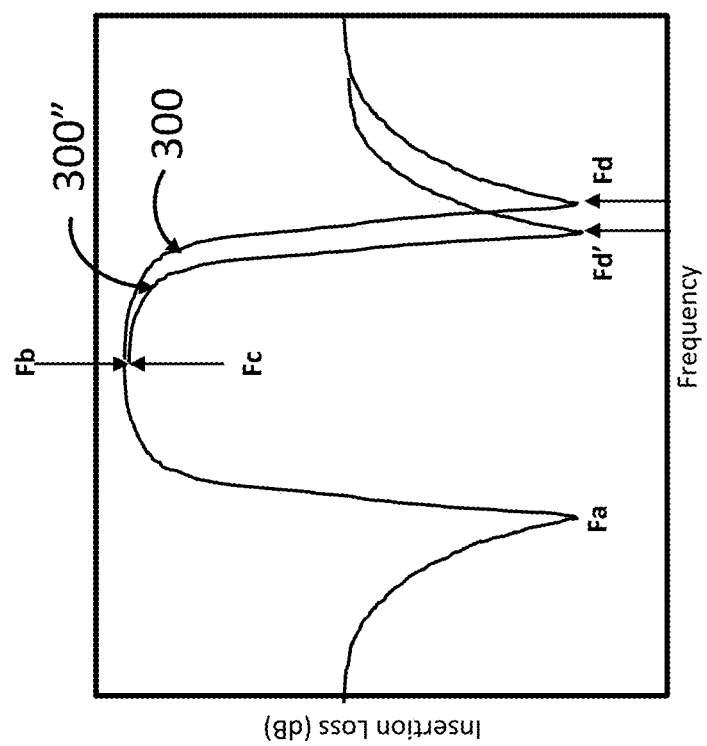
FIG. 17c is a frequency response plot of the passband of the enhanced acoustic filter of FIG. 17b.

Referring now to FIGS. 17a-17c, assume that a capacitance $C_{se}$ is added in parallel with the in-line acoustic resonator $Z_S$ of the original filter circuit 300 (FIG. 17a), and the in-line acoustic resonator $Z_S$ is replaced with the MBVD model 110 illustrated in FIG. 3 to create a new filter circuit 300" (FIG. 17b), which yields an $|S21|^2$ frequency response in comparison with the $|S21|^2$ frequency response of the original filter circuit 300 (FIG. 17c).

In the new filter circuit 300", the reflection zero located in the passband is effectively the resonance created by $L_{m2}$ and $C_{m2}$ (i.e., the resonance of the acoustic resonator $Z_S$). This reflection zero, therefore, remains unchanged with the addition of the capacitance $C_{se}$, and is thus, located at the frequency $F_c$ given by equation [7] above. The transmission zero located at the right edge of the passband is effectively the resonance created by the circuit $L_{m2}$, $C_{m2}$, and $C_{02}$ (i.e., the anti-resonance of the acoustic resonator $Z_S$), and is given by:

$$F'_d = \frac{1}{2\pi \sqrt{\frac{L_{m2} \cdot C_{m2} \cdot (C_{02} + C_{se})}{C_{m2} + C_{02} + C_{se}}}}. \quad [9]$$

The relationship between the transmission zero $F_d$ in equation [8] and the transmission zero $F_d'$ in equation [10] can be determined by assigning values to the lumped elements and solving equations [8] and [10]. Setting $L_{m2}=C_{m2}=C_{02}=1$, then $$F_d = \frac{k}{\sqrt{0.5}} \text{ and } F'_d = \frac{k}{\sqrt{\frac{1+C_{se}}{2+C_{se}}}},$$

where k is a constant. When $C_{se}=0$, $F_d=F_d'$. For any positive values of $C_{se}$, then $F_d'<F_d$.

As can be appreciated from the foregoing, the result of adding a capacitance $C_{se}$ in parallel with the in-line resonator $Z_S$ does not affect the location of the reflection zero $F_c$, but causes the transmission zero $F_d$ to move down in frequency to $F_d'$. The filter match is not greatly affected, and the frequency response of the resulting filter is narrower and also steeper on the high side of the passband.

Thus, adding capacitance in parallel to shunt resonators of an acoustic filter narrows and steepens the lower edge of the passband, while adding capacitance in parallel to in-line resonators of an acoustic filter narrows and steepens the upper edge of the passband. It follows that adding capacitance in parallel to both the shunt and in-line resonators of an acoustic filter narrows and steepens both edges of the passband. Thus, narrower filters can be realized with piezoelectric materials that are normally used for wider bandwidth filters. By making the acoustic filter narrower, the passband insertion loss increases and the filter skirts become steeper. The benefits of increasing the steepness of the passband can be realized by moving the entire filter up or down in frequency to maximize customer specification from band edge to rejection frequencies.

Figure 18:
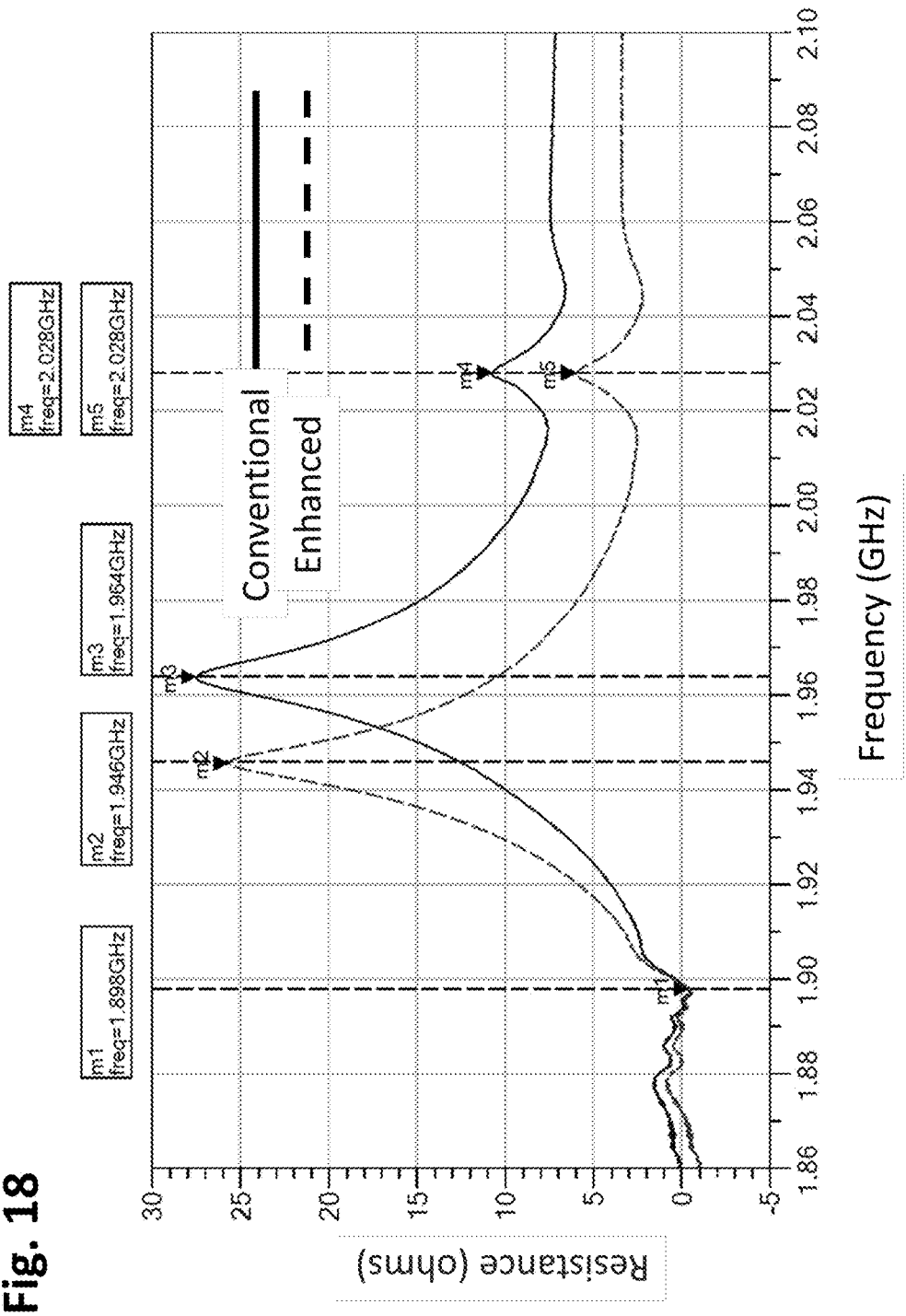
FIG. 18 is a frequency response plot comparing an enhanced acoustic resonator with a conventional acoustic resonator.

Adding capacitance in parallel to shunt resonators of the acoustic filter also effectively moves the upper Bragg Band resonance further from the passband. For example, referring to FIG. 18, the frequency response (in terms of the real impedance) of a conventional shunt resonator without an added parallel capacitance, and the frequency response (in terms of real impedance) of an enhanced shunt resonator with an added parallel capacitance of 1.0 pF can be compared. The resonances of both the conventional acoustic resonator and the enhanced acoustic resonator are the same and are shown at marker m1 (1.898 GHz). Likewise, the upper Bragg Band frequencies of both the conventional acoustic resonator and the enhanced acoustic resonator are the same and are shown at markers m4 and m5 (2.028 GHz). The anti-resonance of the conventional acoustic resonator is shown at marker m3 (1.964 GHz), while the anti-resonance of the enhanced acoustic resonator is shown at marker m2 (1.964 GHz). As can be appreciated, for the conventional acoustic resonator, the upper Bragg band frequency at marker m4 is higher than the anti-resonant frequency at marker m3 by 64 MHz, whereas for the enhanced acoustic resonator, the upper Bragg band frequency at marker m5 is higher than the anti-resonant frequency at marker m2 by 82 MHz. Thus, if the enhanced acoustic resonator is designed so that the anti-resonance falls at the center of the passband of the bandpass filter, the additional parallel capacitance will push the upper Bragg Band frequency higher away from the passband.

As briefly discussed above, it is preferable that the lumped capacitive structures 260 avoid coupling the acoustic waves originating from the lumped resonator structures 258. Furthermore, it is desirable that the lumped capacitive structures 260 be capable of handling high power without incurring damage. To this end, several novel designs of lumped capacitive structures 260 that avoid or minimize coupling acoustic waves originating from the interdigitated resonator fingers 266 and/or handle high power without incurring damage, will now be described. Like the previously described lumped capacitive structures 260a, 260b, the following described lumped capacitive structures 260 are monolithically disposed on the piezoelectric layer 252 (which may, e.g., be a piezoelectric substrate or a thin-film piezoelectric monolithically disposed on a non-piezoelectric substrate) and are electrically coupled (e.g., in parallel) to the acoustic resonator structure 258.

The following lumped capacitive structures 260 are described as being electrically coupled between the metalized input signal plane portion 254a and the metalized output signal plane portion 254b, similar to the lumped capacitive structure 260a illustrated in FIG. 11b, although the following lumped capacitive structures 260 may be alternatively electrically coupled between the metalized signal plane 254 and the metalized ground plane 256, similar to the lumped capacitive structure 260b illustrated in FIG. 12. The following described lumped capacitive structures 260 may be partially nested within, fully nested within, or not nested at all within, the metalized input signal plane portion 254a, metalized output signal plane portion 254b, metalized input signal plane 254, or metalized ground plane 256.

Figure 19A:
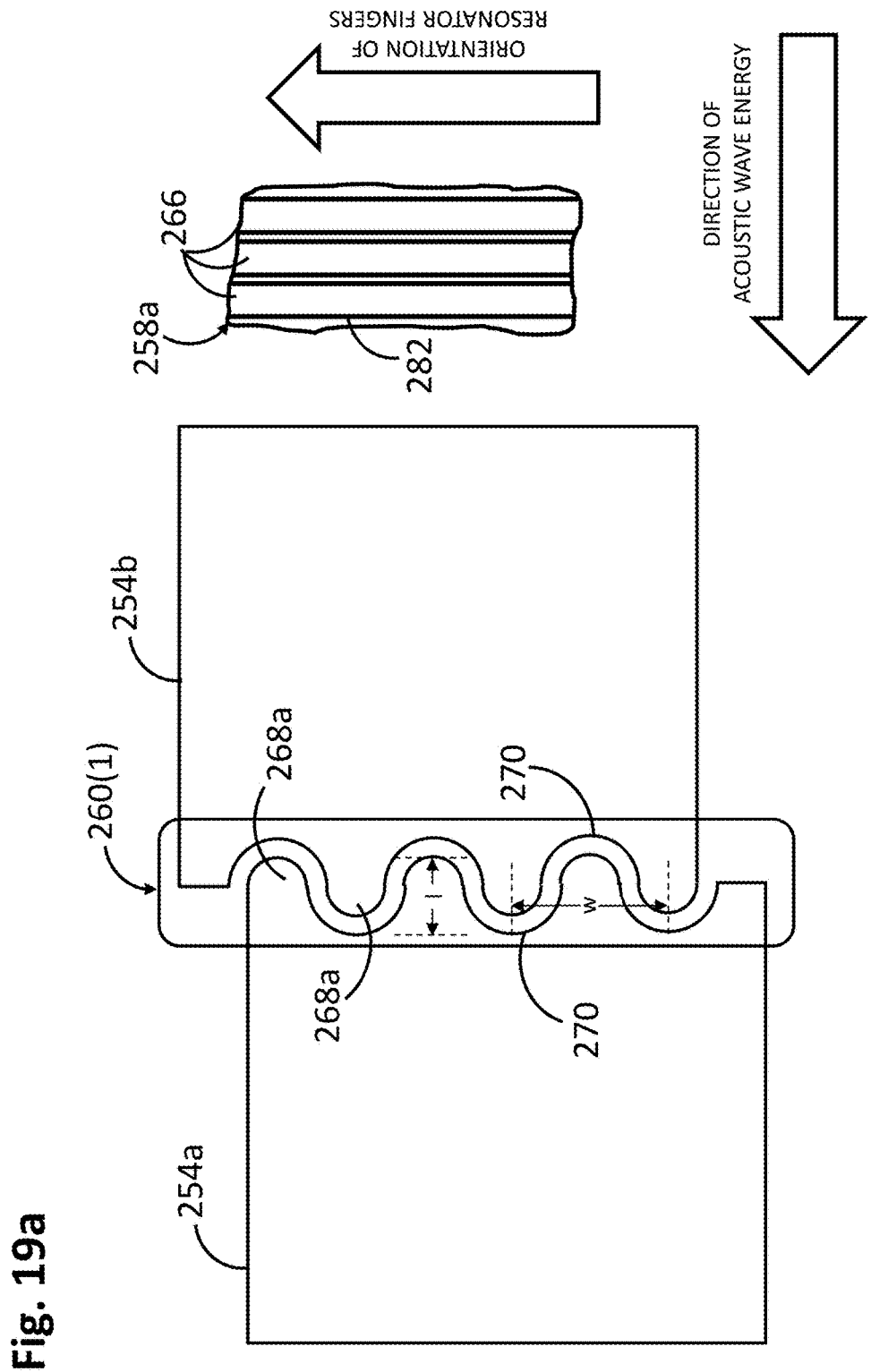
FIG. 19a is a plan view of one embodiment of a lumped capacitive structure that can be used in the acoustic filter of FIG. 5, particularly showing the lumped capacitive structure oriented orthogonal to the lumped resonant structure.

Referring first to FIG. 19a-19c, one embodiment of a lumped capacitive structure 260(1) comprises an arrangement of planar interdigitated capacitive fingers 268a. The orientation of the interdigitated capacitive fingers 268a may be orthogonal to the orientation of the interdigitated resonator fingers 266 of the lumped resonator structure 258a (FIG. 19a), parallel to the orientation of the interdigitated resonator fingers 266 of the lumped resonator structure 258a (FIG. 19b), or oblique to the orientation of the interdigitated resonator fingers 266 of the lumped resonator structure 258a (FIG. 19c).

Each of at least one of the interdigitated capacitive fingers 268a (in the illustrated embodiment, all of the interdigitated capacitive fingers 268a) has an edge 270 that is entirely continuous (i.e., there are no discontinuities, such as sharp corners, along the entire edge). In the embodiment illustrated in FIGS. 19a-19c, the edge 270 of each interdigitated capacitive finger 268a takes the form of a single undulation. Because there are no discontinuities in the edges 270 of the interdigitated capacitive fingers 268a, electrical power will not be concentrated or focused on any portions of the edges 270.

At least one of the interdigitated capacitive fingers 268a (in the illustrated embodiment, all of the interdigitated capacitive fingers 268a) has a length (l)-to-width (w) ratio of less than two, and preferably, a length-to-width ratio of less than one. Furthermore, it should be appreciated that no finite portion of the edge 270 along the length of each of at least one of the interdigitated capacitive fingers 268a (in the illustrated embodiment, all of the interdigitated capacitive fingers 268a) is parallel to any finite portions of edges 282 (in this case, the straight edges 282) along the lengths of the interdigitated resonator fingers 266. This remain true regardless of the orientation of the interdigitated capacitive fingers 268a relative to the orientation of the interdigitated resonator fingers 266 of the lumped resonator structure 258a, as can be seen in FIGS. 19a-19c.

Due to the relatively short interdigitated capacitive fingers 268a in the acoustically active direction and the non-parallel relationship between the continuous edges 270 of the interdigitated capacitive fingers 268a and the straight edges 280 of the interdigitated resonator fingers 266, coupling of acoustic waves originating from the lumped resonator structure 258a into the lumped capacitive structure 260(1) is minimized.

Figure 20A:
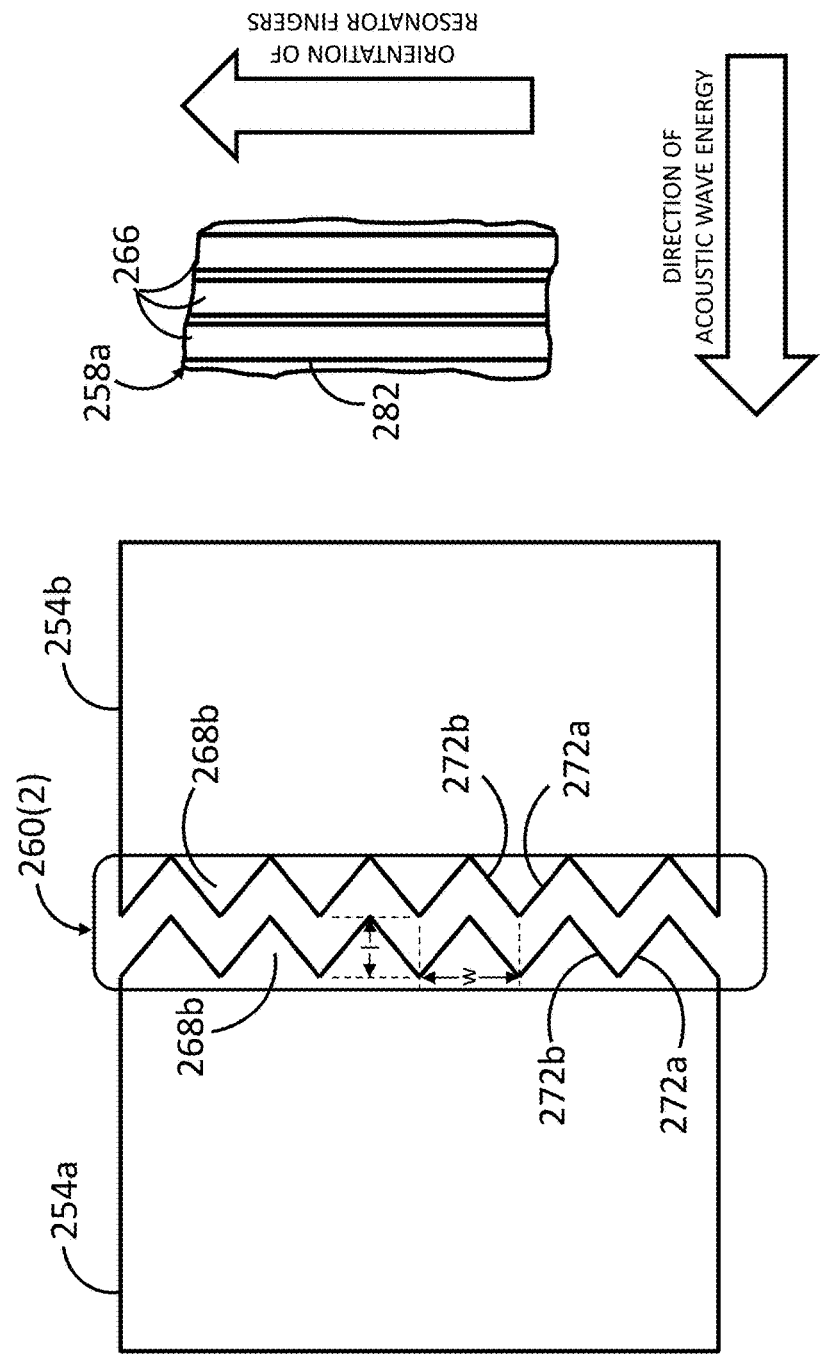
FIG. 20a is a plan view of another embodiment of a lumped capacitive structure that can be used in the acoustic filter of FIG. 5, particularly showing the lumped capacitive structure oriented orthogonal to the lumped resonant structure.

Referring next to FIG. 20a-20c, another embodiment of a lumped capacitive structure 260(2) comprises an arrangement of planar interdigitated capacitive fingers 268b. The orientation of the interdigitated capacitive fingers 268b may be orthogonal to the orientation of the interdigitated resonator fingers 266 of the lumped resonator structure 258a (FIG. 20a), parallel to the orientation of the interdigitated resonator fingers 266 of the lumped resonator structure 258a (FIG. 20b), or orthogonal to the orientation of the interdigitated resonator fingers 266 of the lumped resonator structure 258a (FIG. 20c).

As with the embodiment illustrated in FIGS. 19a-19c, at least one of the interdigitated capacitive fingers 268b (in the illustrated embodiment, all of the interdigitated capacitive fingers 268b) has a length (l)-to-width (w) ratio of less than two, and preferably, a length-to-width ratio of less than one. However, unlike the embodiment illustrated in FIGS. 19a-19c, each of at least one of the interdigitated capacitive fingers 268b (in the illustrated embodiment, all of the interdigitated capacitive fingers 268b) has straight edges 272a, 272b that takes the form of a single sawtooth instead of a single undulation.

Furthermore, with respect to FIGS. 20a and 20b, no finite portion of the edge 272a, 272b along the length of each of at least one of the interdigitated capacitive fingers 268b (in the illustrated embodiment, all of the interdigitated capacitive fingers 268b) is parallel to any finite portions of edges 282 (in this case, the straight edges 282) along the length of the interdigitated resonator fingers 266. In the illustrated embodiment, the straight edges 272a, 272b of each of the interdigitated capacitive fingers 268b are oriented at a 45-degree angle relative to the orientation of the straight edges 282 of the interdigitated resonator fingers 266. In the embodiment illustrated in FIG. 20c, the edge 272a of each of the interdigitated capacitive fingers 268b is orthogonal to the straight edges 282 of each of the interdigitated capacitive fingers 268b, whereas the edge 272b of each of the interdigitated capacitive fingers 268b is parallel to the straight edges 282 of each of the interdigitated capacitive fingers 268b.

Thus, due to the relatively short interdigitated capacitive fingers 268b in the acoustically active direction and the non-parallel relationship between the edges 272a and 272b as shown in FIGS. 20a and 20b, and 272a as shown in FIG. 20c, of the interdigitated capacitive fingers 268b and the straight edges 282 of the interdigitated resonator fingers 266, coupling of acoustic waves originating from the lumped resonator structure 258a into the lumped capacitive structure 260(2) is minimized.

The embodiments illustrated in FIGS. 19 and 20 lend themselves well to lumped capacitive structures 268 with relatively low static capacitance requirements. However, for lumped capacitive structures 268 with relatively high static capacitance requirements, the embodiments illustrated in FIGS. 21 and 22 may be used.

Figure 21B:
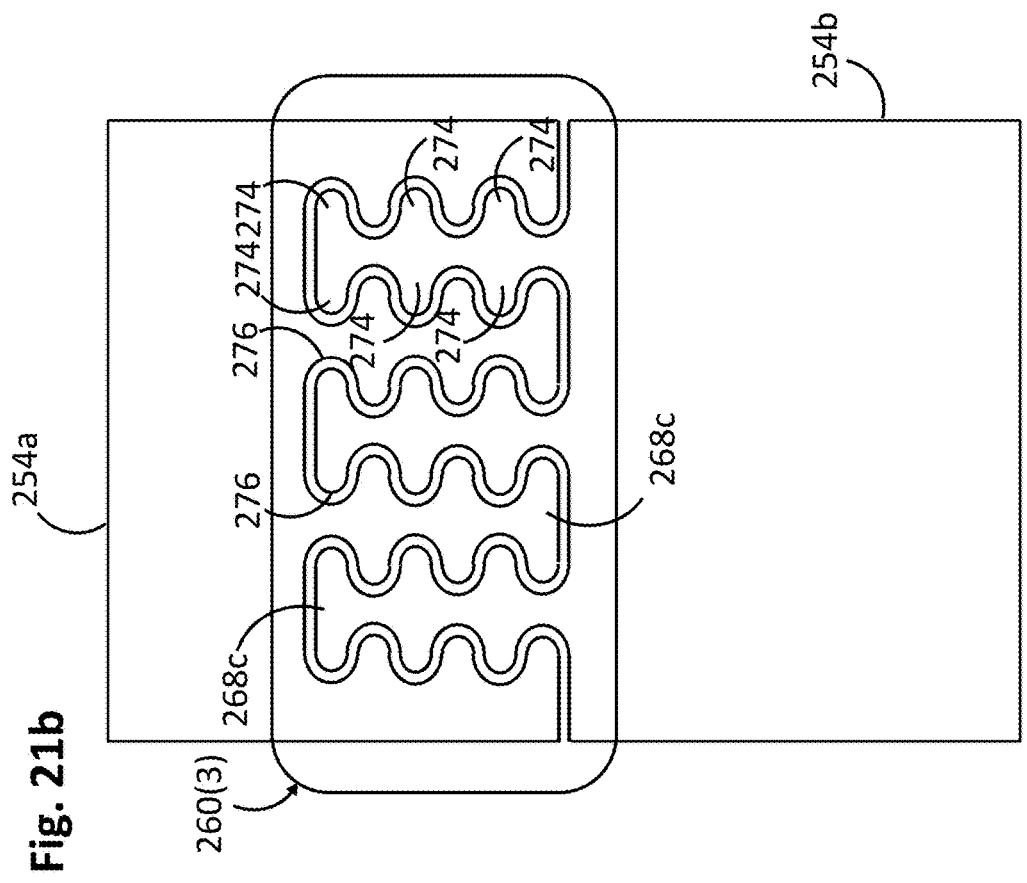
FIG. 21b is a plan view of the embodiment of the lumped capacitive structure of FIG. 21a, particularly showing the lumped capacitive structure oriented parallel to the lumped resonant structure.
Figure 21C:
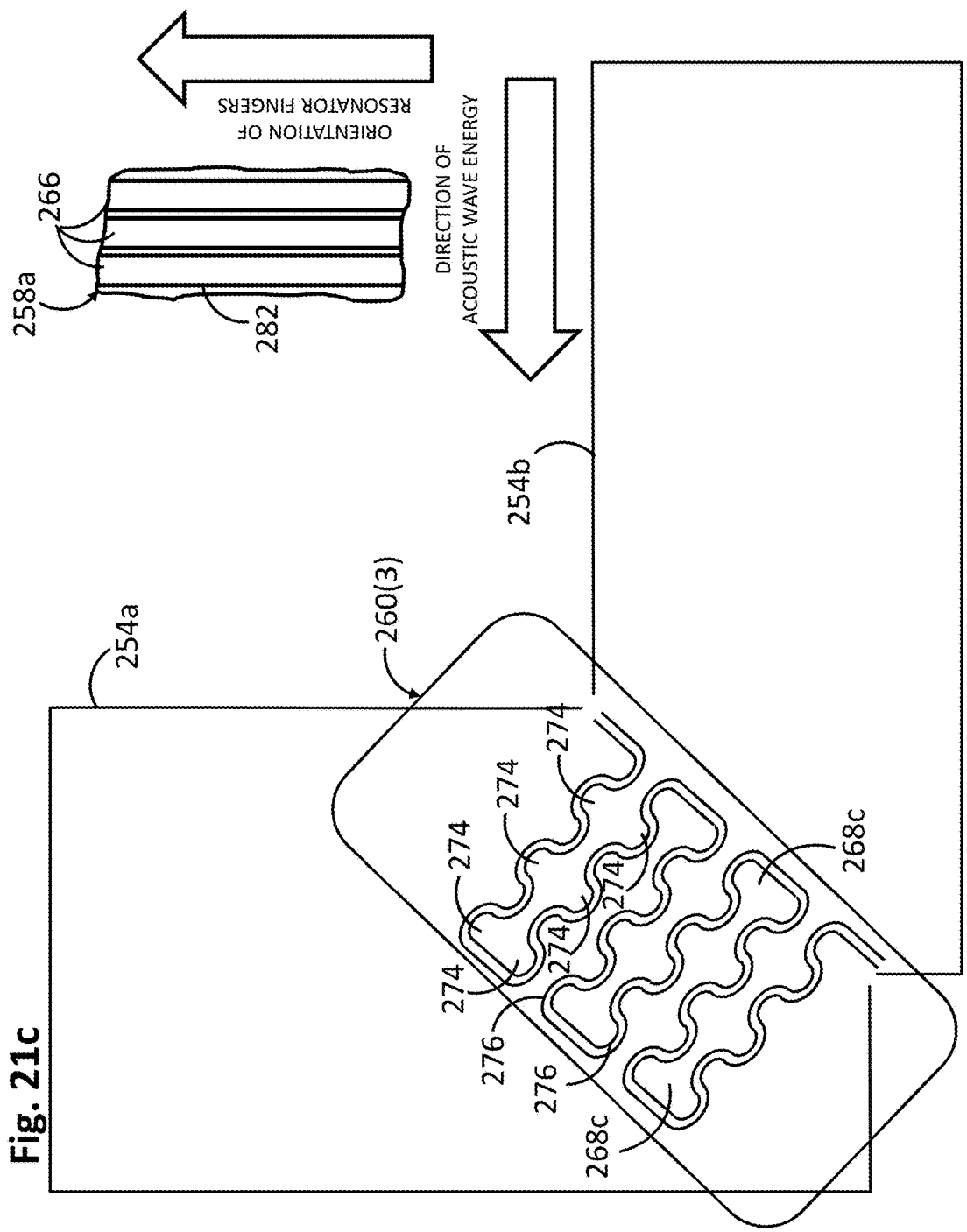
FIG. 21c is a plan view of the embodiment of the lumped capacitive structure of FIG. 21a, particularly showing the lumped capacitive structure oriented oblique to the lumped resonant structure.

In particular, referring first to FIGS. 21a-21c, still another embodiment of a lumped capacitive structure 260(3) comprises an arrangement of planar interdigitated capacitive fingers 268c. The orientation of the interdigitated capacitive fingers 268c may be orthogonal to the orientation of the interdigitated resonator fingers 266 of the lumped resonator structure 258a (FIG. 21a), parallel to the orientation of the interdigitated resonator fingers 266 of the lumped resonator structure 258a (FIG. 21b), or oblique to the orientation of the interdigitated resonator fingers 266 of the lumped resonator structure 258a (FIG. 21c).

The lumped capacitive structure 260(3) is similar to the embodiment illustrated in FIGS. 19a-19c, with the exception that each of the interdigitated capacitive fingers 268c has an edge that forms a plurality of undulations, instead of a single undulation. In this manner, each of the interdigitated capacitive fingers 268c comprises a plurality of interdigitated capacitive sub-fingers 274, thereby increasing the effective lengths, and thus the static capacitances, of the interdigitated capacitive fingers 268c. As can be seen in FIGS. 21a-21c, all of the interdigitated capacitive sub-fingers 274 of each interdigitated capacitive finger 268c have an orientation that is orthogonal to the orientation of the respective interdigitated capacitive finger 268c. Each of the interdigitated capacitive sub-fingers 274 of each least one of the interdigitated capacitive fingers 268c (in the illustrated embodiment, all of the interdigitated capacitive fingers 268c) has an edge 276 that is entirely continuous (i.e., there are no discontinuities, such as sharp corners). Because there are no discontinuities in the edges 276 of the interdigitated capacitive sub-fingers 274, electrical power will not be concentrated or focused on any portions of the edges 276.

No finite portion of the edge 276 along each of at least one of the interdigitated capacitive sub-fingers 274 (in the illustrated embodiment, all of the interdigitated capacitive sub-fingers 274) is parallel to any finite portions of edges 282 (in this case, the straight edges 282) along the lengths of the interdigitated resonator fingers 266. This remains true regardless the orientation of the orientation of the interdigitated capacitive fingers 268a relative to the orientation of the interdigitated resonator fingers 266 of the lumped resonator structure 258a, as can be seen in FIGS. 21a-21c. Due to the non-parallel relationship between the edges 276 of the interdigitated capacitive sub-fingers 274 and the straight edges 280 of the interdigitated resonator fingers 266, coupling of acoustic waves originating from the lumped resonator structure 258a into the lumped capacitive structure 260(3) is minimized.

Figure 22A:
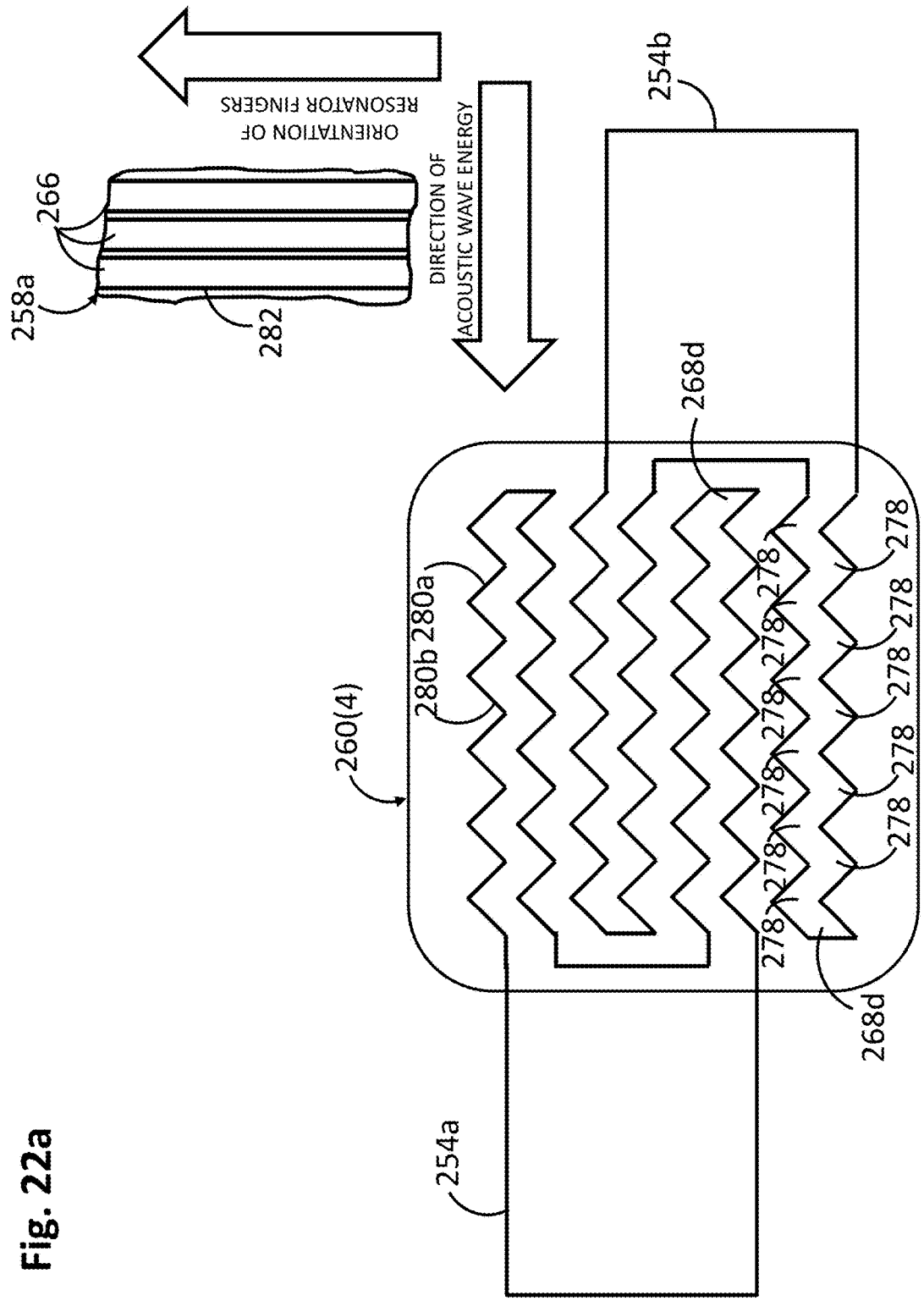
FIG. 22a is a plan view of yet another embodiment of a lumped capacitive structure that can be used in the acoustic filter of FIG. 5, particularly showing the lumped capacitive structure oriented orthogonal to the lumped resonant structure.
Figure 22C:
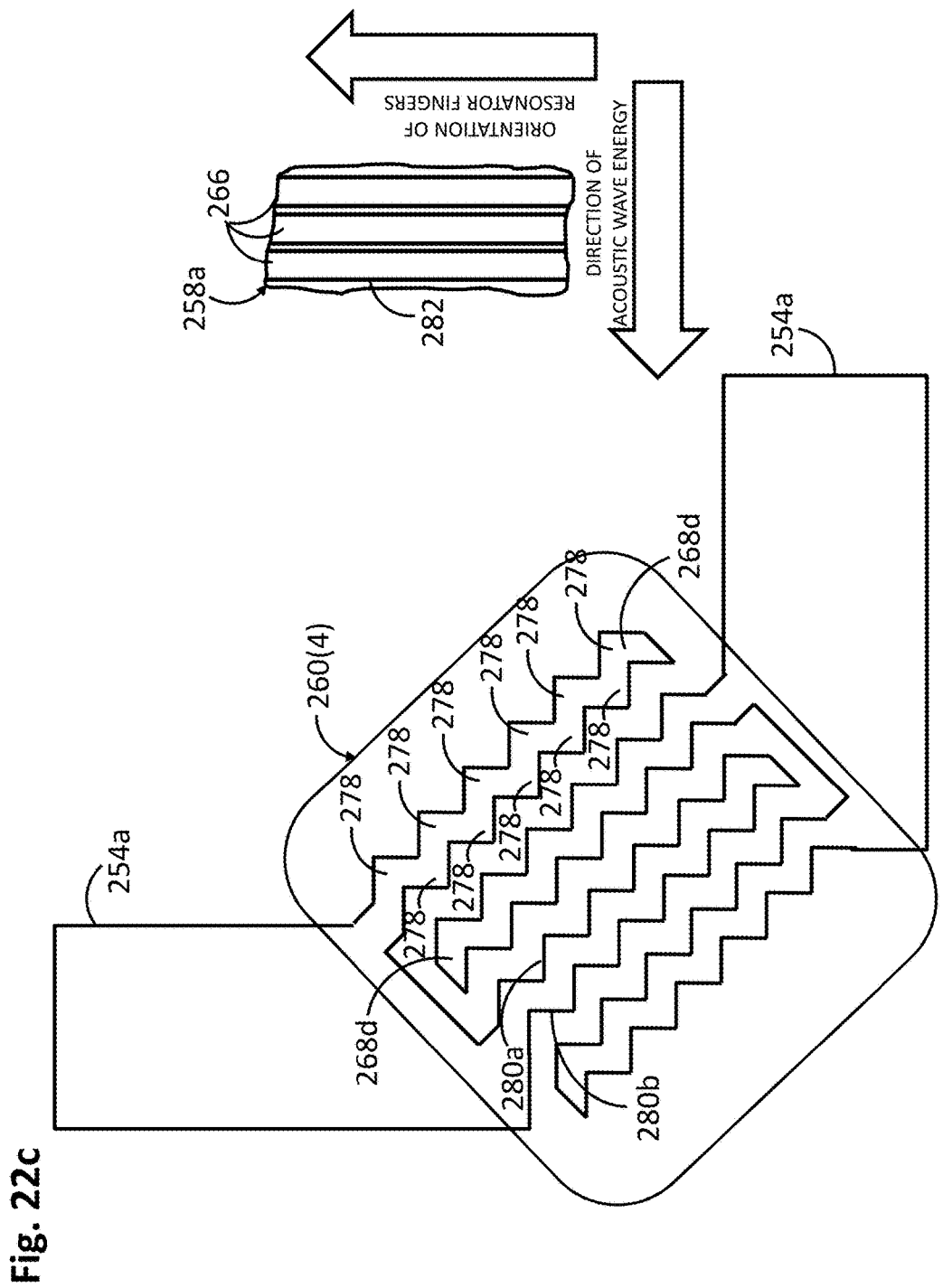
FIG. 22c is a plan view of the embodiment of the lumped capacitive structure of FIG. 22a, particularly showing the lumped capacitive structure oriented oblique to the lumped resonant structure.

Referring now to FIG. 22a-22c, yet another embodiment of a lumped capacitive structure 260(4) comprises an arrangement of planar interdigitated capacitive fingers 268d. The orientation of the interdigitated capacitive fingers 268d may be orthogonal to the orientation of the interdigitated resonator fingers 266 of the lumped resonator structure 258a (FIG. 22a), parallel to the orientation of the interdigitated resonator fingers 266 of the lumped resonator structure 258a (FIG. 22b), or oblique to the orientation of the interdigitated resonator fingers 266 of the lumped resonator structure 258a (FIG. 22c).

As with the embodiment illustrated in FIGS. 21a-21c, each of the interdigitated capacitive fingers 268d shown in FIGS. 22a-22c comprises a plurality of interdigitated capacitive sub-fingers 278, thereby increasing the effective lengths, and thus the static capacitances, of the interdigitated capacitive fingers 268d. As can be seen in FIGS. 22a-22c, all of the interdigitated capacitive sub-fingers 278 of each interdigitated capacitive finger 268d have an orientation that is orthogonal to the orientation of the respective interdigitated capacitive finger 268d. However, unlike the embodiment illustrated in FIGS. 21a-21c, each interdigitated capacitive sub-finger 278 has two straight edges 280a, 280b that forms a sawtooth.

With respect to FIGS. 22a and 22b, no finite portion of the straight edges 280a, 280b along the length of each of at least one of the interdigitated capacitive sub-fingers 278 (in the illustrated embodiment, all of the interdigitated capacitive sub-fingers 278) is parallel to any finite portions of edges 282 (in this case, the straight edges 282) along the length of the interdigitated resonator fingers 266. In the illustrated embodiment, the straight edges 280a, 280b of each of the interdigitated capacitive sub-fingers 278 are oriented at a 45-degree angle relative to the orientation of the straight edges 282 of the interdigitated resonator fingers 266. In the embodiment illustrated in FIG. 22c, the edge 280a of each of the interdigitated capacitive sub-fingers 278 is orthogonal to the straight edges 282 along the length of the interdigitated resonator fingers 266, whereas the edge 280b of each of the interdigitated capacitive sub-fingers 278 is parallel to the straight edges 282 along the length of the interdigitated resonator fingers 266.

Thus, due to the non-parallel relationship between the edges 280a and 280b as shown in FIGS. 22a and 22b, and 280a as shown in FIG. 22c, of the interdigitated capacitive sub-fingers 278 and the straight edges 282 of the interdigitated resonator fingers 266, coupling of acoustic waves originating from the lumped resonator structure 258a into the lumped capacitive structure 260(4) is minimized.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. An acoustic filter, comprising:
   a piezoelectric layer;
   an acoustic resonator structure monolithically disposed on the piezoelectric layer, the acoustic resonator structure comprising an arrangement of planar interdigitated resonator fingers; and
   a lumped capacitive structure monolithically disposed on the piezoelectric layer and being electrically coupled to the acoustic resonator structure, the lumped capacitive structure comprising an arrangement of planar interdigitated capacitive fingers, wherein at least one of the interdigitated capacitive fingers and at least one of the interdigitated resonator fingers have orientations that are oblique to each other.

2. The acoustic filter of claim 1, wherein the interdigitated capacitive fingers have edges that are entirely continuous.

3. The acoustic filter of claim 2, wherein the entirely continuous edge of at least one interdigitated capacitive finger has one or more undulations.

4. The acoustic filter of claim 2, wherein the entirely continuous edge of at least one interdigitated capacitive finger has a plurality of undulations.

5. The acoustic filter of claim 2, wherein no finite portion of the continuous edge is parallel to any finite portions of edges along the lengths of the interdigitated resonator fingers.

6. The acoustic filter of claim 1, wherein the lumped capacitive structure is electrically coupled in parallel to the acoustic resonator structure.

7. The acoustic filter of claim 1, wherein at least one interdigitated capacitive finger has a length/width ratio of less than two.

8. The acoustic filter of claim 1, wherein at least one interdigitated capacitive finger has a length/width ratio of less than one.

9. The acoustic filter of claim 1, wherein at least one interdigitated capacitive finger comprises a plurality of interdigitated capacitive sub-fingers.

10. The acoustic filter of claim 9, wherein the plurality of interdigitated capacitive sub-fingers has an orientation that is orthogonal to the orientation of the at least one interdigitated capacitive finger.

11. The acoustic filter of claim 1, further comprising a non-piezoelectric substrate, wherein the piezoelectric layer is monolithically disposed on the non-piezoelectric substrate.

12. The acoustic filter of claim 11, wherein the piezoelectric layer is a thin-film piezoelectric.

13. The acoustic filter of claim 1, wherein all of the interdigitated capacitive fingers and all of the interdigitated resonator fingers have orientations that are oblique to each other.

14. The acoustic filter of claim 1, further comprising:
   a metalized signal plane monolithically disposed on the piezoelectric layer; and
   a metalized ground plane monolithically disposed on the piezoelectric layer, wherein each of the acoustic resonator structure and the lumped capacitive structure is electrically coupled between the signal plane and the ground plane.

15. The acoustic filter of claim 14, wherein the lumped capacitive structure is least partially nested within at least one of the signal plane and the ground plane.

16. The acoustic filter of claim 14, wherein the lumped capacitive structure is fully nested within at least one of the signal plane and the ground plane.

17. The acoustic filter of claim 1, further comprising:
   a metalized input signal plane portion monolithically disposed on the piezoelectric layer; and a metalized output signal plane portion monolithically disposed on the piezoelectric layer, wherein each of the acoustic resonator structure and the capacitive resonator structure is electrically coupled between the input signal plane portion and the output signal plane portion.

18. The acoustic filter of claim 17, wherein the lumped capacitive structure is least partially nested within at least one of the input signal plane portion and the output signal plane portion.

19. The acoustic filter of claim 17, wherein the lumped capacitive structure is fully nested within at least one of the input signal plane portion and the output signal plane portion.

20. The acoustic filter of claim 1, wherein the piezoelectric layer is a piezoelectric substrate.

21. An acoustic filter, comprising:
a piezoelectric layer;
an acoustic resonator structure monolithically disposed on the piezoelectric layer, the acoustic resonator structure comprising an arrangement of planar interdigitated resonator fingers;
a lumped capacitive structure monolithically disposed on the piezoelectric layer and being electrically coupled to the acoustic resonator structure, the lumped capacitive structure comprising an arrangement of planar interdigitated capacitive fingers,
a metalized input signal plane portion monolithically disposed on the piezoelectric layer; and
a metalized output signal plane portion monolithically disposed on the piezoelectric layer, wherein each of the acoustic resonator structure and the capacitive resonator structure is electrically coupled between the input signal plane portion and the output signal plane portion, and wherein the lumped capacitive structure is least partially nested within at least one of the input signal plane portion and the output signal plane portion.

22. An acoustic filter, comprising:
a piezoelectric layer;
an acoustic resonator structure monolithically disposed on the piezoelectric layer, the acoustic resonator structure comprising an arrangement of planar interdigitated resonator fingers;
a lumped capacitive structure monolithically disposed on the piezoelectric layer and being electrically coupled to the acoustic resonator structure, the lumped capacitive structure comprising an arrangement of planar interdigitated capacitive fingers,
a metalized input signal plane portion monolithically disposed on the piezoelectric layer; and
a metalized output signal plane portion monolithically disposed on the piezoelectric layer, wherein each of the acoustic resonator structure and the capacitive resonator structure is electrically coupled between the input signal plane portion and the output signal plane portion, and wherein the lumped capacitive structure is fully nested within at least one of the input signal plane portion and the output signal plane portion.

* * * * *